United States Patent
Eaton et al.

(10) Patent No.: US 10,832,747 B2
(45) Date of Patent: *Nov. 10, 2020

(54) CLOCKED COMMANDS TIMING ADJUSTMENTS METHOD IN SYNCHRONOUS SEMICONDUCTOR INTEGRATED CIRCUITS

(71) Applicant: Integrated Silicon Solution, Inc., Milpitas, CA (US)

(72) Inventors: Steven Eaton, Monument, CO (US); Matthew Manning, Colorado Springs, CO (US)

(73) Assignee: Integrated Silicon Solution, Inc., Milpitas, CA (US)

( * ) Notice: Subject to any disclaimer, the term of this patent is extended or adjusted under 35 U.S.C. 154(b) by 2 days.

This patent is subject to a terminal disclaimer.

(21) Appl. No.: 16/261,379

(22) Filed: Jan. 29, 2019

(65) Prior Publication Data

US 2019/0172511 A1    Jun. 6, 2019

Related U.S. Application Data

(63) Continuation of application No. 15/337,979, filed on Oct. 28, 2016, now Pat. No. 10,236,042.

(51) Int. Cl.
  *G11C 7/22* (2006.01)
  *H04L 7/00* (2006.01)
  *G11C 29/02* (2006.01)

(52) U.S. Cl.
  CPC .......... *G11C 7/222* (2013.01); *G11C 29/023* (2013.01); *G11C 29/028* (2013.01); *H04L 7/005* (2013.01); *H04L 7/0008* (2013.01)

(58) Field of Classification Search
  None
  See application file for complete search history.

(56) References Cited

U.S. PATENT DOCUMENTS

| | | |
|---|---|---|
| 5,784,332 A | 7/1998 | Zheng et al. |
| 6,262,938 B1 | 7/2001 | Lee et al. |
| 6,757,212 B2 | 6/2004 | Hamamoto et al. |
| 6,850,458 B2 | 2/2005 | Li |
| 6,965,530 B2 | 11/2005 | Shimbayashi |
| 7,406,637 B2 | 7/2008 | Fukuda |

(Continued)

FOREIGN PATENT DOCUMENTS

JP    2001195881 A    7/2001

*Primary Examiner* — J. H. Hur
(74) *Attorney, Agent, or Firm* — Carmen C. Cook

(57) ABSTRACT

A method in a clocked integrated circuit receiving an input clock signal having a clock frequency and a command signal for accessing a memory element in the clocked integrated circuit. The method detects the input clock signal having a clock frequency above or below a frequency threshold. The method generates a clock detect output signal having a first logical state in response to the clock frequency being below the frequency threshold and generates the clock detect output signal having a second logical state in response to the clock frequency being above the frequency threshold. The method delays the command signal by a first timing latency to generate a timing adjusted control signal where the first timing latency is one or more clock periods of the input clock signal. Finally, the method adjusts the first timing latency in response to the clock detect output signal.

20 Claims, 13 Drawing Sheets

(56) References Cited

U.S. PATENT DOCUMENTS

| | | |
|---|---|---|
| 7,516,029 B2 | 4/2009 | Kim et al. |
| 7,778,099 B2 | 8/2010 | Fujioka |
| 8,149,644 B2 | 4/2012 | Fujioka et al. |
| 8,400,845 B2 | 3/2013 | Do et al. |
| 8,559,258 B1 | 10/2013 | Stephens, Jr. |
| 8,564,999 B1 | 10/2013 | Stephens, Jr. |
| 8,565,029 B1 | 10/2013 | Stephens, Jr. |
| 8,599,595 B1 | 12/2013 | Stephens, Jr. |
| 8,614,909 B1 | 12/2013 | Stephens, Jr. |
| 8,659,928 B1 | 2/2014 | Stephens, Jr. |
| 8,681,524 B1 | 3/2014 | Stephens, Jr. |
| 8,730,705 B1 | 5/2014 | Stephens, Jr. |
| 8,743,583 B1 | 6/2014 | Stephens, Jr. |
| 8,743,649 B2 | 6/2014 | Sato |
| 8,891,278 B1 | 11/2014 | Stephens, Jr. |
| 8,897,053 B1 | 11/2014 | Stephens, Jr. |
| 8,917,568 B2 | 12/2014 | Chen et al. |
| 8,971,085 B2 | 3/2015 | Stephens, Jr. |
| 9,536,591 B1 | 1/2017 | Kwak |
| 10,068,626 B2 * | 9/2018 | Eaton .................. G11C 7/222 |
| 10,236,042 B2 * | 3/2019 | Eaton .................. G11C 7/222 |
| 2001/0007539 A1 | 7/2001 | Tanaka et al. |
| 2001/0019284 A1 | 9/2001 | Buck |
| 2002/0176316 A1 | 11/2002 | Benedix et al. |
| 2003/0086330 A1 | 5/2003 | Chung |
| 2003/0223293 A1 | 12/2003 | Kawaguchi et al. |
| 2005/0187724 A1 | 8/2005 | Kim et al. |
| 2005/0270890 A1 | 12/2005 | Kim |
| 2006/0233030 A1 | 10/2006 | Choi |
| 2008/0253205 A1 | 10/2008 | Park |
| 2009/0161468 A1 | 6/2009 | Fujioka |
| 2010/0135100 A1 | 6/2010 | Chiu |
| 2010/0271092 A1 | 10/2010 | Zerbe et al. |
| 2011/0242911 A1 | 10/2011 | Ko |
| 2012/0269015 A1 | 10/2012 | Bringivijayaraghavan |
| 2013/0208818 A1 | 8/2013 | Shaeffer et al. |
| 2013/0342254 A1 | 12/2013 | Mazumder et al. |
| 2013/0346721 A1 | 12/2013 | Giovannini et al. |
| 2014/0119141 A1 | 5/2014 | Tamlyn et al. |
| 2015/0221355 A1 | 8/2015 | Vo et al. |
| 2018/0053538 A1 | 2/2018 | Miyano et al. |
| 2018/0122438 A1 | 5/2018 | Manning et al. |

* cited by examiner

CLOCKED COMMANDS TIMING ADJUSTMENTS METHOD IN SYNCHRONOUS SEMICONDUCTOR INTEGRATED CIRCUITS

CROSS REFERENCE TO OTHER APPLICATIONS

This application is a continuation of U.S. patent application Ser. No. 15/337,979, entitled CLOCKED COMMANDS TIMING ADJUSTMENTS METHOD IN SYNCHRONOUS SEMICONDUCTOR INTEGRATED CIRCUITS, filed Oct. 28, 2016, now U.S. Pat. No. 10,236,042, issued Mar. 19, 2019, which is incorporated herein by reference for all purposes.

BACKGROUND OF THE INVENTION

Synchronous or clocked semiconductor integrated circuits have circuits that are driven by a clock signal. Typically, an input clock is provided to the synchronous semiconductor integrated circuits and internal circuits of the integrated circuits are driven by the input clock or a derivative of the input clock.

In clocked controlled integrated circuits, one major concern during operation is with sequencing and capturing of various internal timing signals. Internal timing signals are generated from both synchronous events which are clock-based and timed from the rising or falling edge of the input clock and asynchronous events which are based on gate delays and/or wire interconnect delays due to the resistance and capacitance of the interconnect wires of the integrated circuit, referred to as RC delays. The first group of internal timing signals—those generated from synchronous events and with timing stems mostly from clock gating—have minimal or no temperature, wafer manufacturing process or voltage dependency on their timing. The first group of internal timing signals will however be directly dependent on the clock frequency. The second group of internal timing signals—those generated from asynchronous events and whose timing stems mostly from gate delays and RC delays—will have their timing being shifted or varied over the allowable range of different temperature, manufacturing process and voltage operating conditions.

In certain situations, internal timing signals can enter into a collision domain. Timing collision occurs when the arrival of a data signal does not match up with a capture signal that is intended to trap and store that data signal. In one example, an output buffer in a clocked integrated circuit is implemented as a first-in-first-out (FIFO) register which is clocked by the input clock or a derivative of the input clock. A collision domain event can occur when data from a subsequent memory read operation, a predominantly asynchronous event, over-writes the data that is latched in an output buffer before the latched data has been read out by the receiving system. In another example, such as during high speed operation, RC delays may cause data from a read operation to arrive at the output buffer later than the time requested and therefore the clocked integrated circuit sends out invalid data.

BRIEF DESCRIPTION OF THE DRAWINGS

Various embodiments of the invention are disclosed in the following detailed description and the accompanying drawings.

FIG. 3($b$) is a block diagram of a clock timing adjust circuit in alternate embodiments of the present invention.

DETAILED DESCRIPTION

Figure 1:
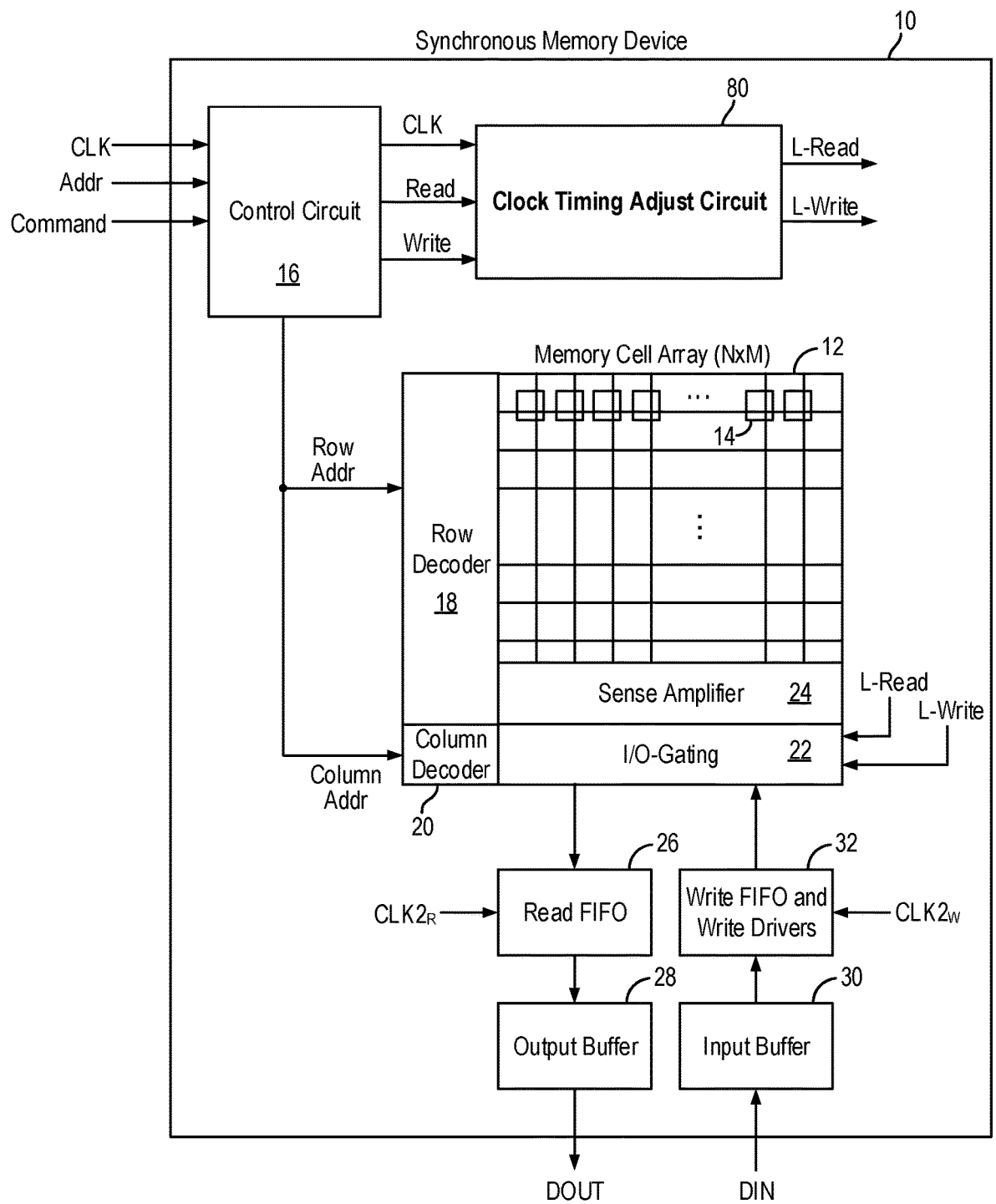
FIG. 1 is a block diagram of a synchronous memory device in which the clock timing adjust circuit can be incorporated in exemplary embodiments of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a clock timing adjust circuit is incorporated in a clocked integrated circuit to detect an operating frequency or a range of operating frequencies of an input clock to the clocked integrated circuit and to adjust the timing latency of an internal control signal for accessing a memory element in the clocked integrated circuit. The clocked integrated circuit receives a command signal to access the memory element in the clocked integrated circuit. The command signal is used to generate an internal control signal which is routed to the memory element of the clocked integrated circuit to access the memory element. The clock timing adjust circuit introduces an adjustable timing latency to the internal control signal derived from the command signal. In embodiments of the present invention, the clock timing adjust circuit operates to shift or adjust the timing latency of the internal control signal during operation to cause clock based operations to either be advanced or delayed by one or more clock cycles in response to the frequency detection. The clock timing adjust circuit of the present invention enables the clocked integrated circuit to be operated over a wide frequency range while ensuring that undesired data collision events are obviated without introducing unnecessary delays.

The clock timing adjust circuit can be implemented without the use of mode register set commands or other non-conventional operation procedures. Rather, the clock timing adjust circuit can operate in real time during normal circuit operation or "on the fly" to adjust internal timing signals for data collision avoidance. The clock timing adjust circuit of the present invention can be advantageously applied in memory circuits such as Dynamic Random Access Memory (DRAM), NAND Flash memory, Static Random Access Memory (SRAM) or other types of volatile or non-volatile memories. The clock timing adjust circuit of the present invention can also be advantageously applied in logic circuits such as microprocessor integrated circuits. In general, the clock timing adjust circuit of the present invention can be applied to any clocked or synchronous integrated circuit containing a memory element, such as an on-chip memory. The clock timing adjust circuit can be advantageously applied to adjust the timing of the internal memory access control signals to obviate collision events that can occur during memory access operations, such as read and write operations of the memory element.

More specifically, in embodiments of the present invention, the clock timing adjust circuit detects that the input clock to the clocked integrated circuit is either running slow (at a low frequency) or is running fast (at a high frequency). The clock timing adjust circuit generates an internal control signal based on the command signal received by the clocked integrated circuit and with a predetermined amount of adjustable timing latency. The clock timing adjust circuit adjusts the timing latency of the internal control signal based on the detected frequency of the input clock and as a function of the command signal. In one example, in response to detecting the input clock is at low frequency the clock timing adjust circuit generates the internal control signal using the predetermined timing latency. However, in response to detecting the input clock is at high frequency the clock timing adjust circuit generates the internal control signal that is either advanced or delayed by one or more clock cycles relative to the predetermined timing latency. In another example, in response to detecting the input clock is at high frequency the clock timing adjust circuit generates the internal control signal using the predetermined timing latency. Meanwhile, in response to detecting the input clock is at low frequency the clock timing adjust circuit generates an internal control signal that is either advanced or delayed by one or more clock cycles relative to the predetermined timing latency.

In particular, the clock timing adjust circuit may generate an internal control signal that is advanced by one or more clock cycles, by removing one or more clock cycles based on the predetermined timing latency. Advancing a control signal by one or more clock cycles introduces one or more additional clock cycles to provide timing margin for downstream data operations. In a clocked memory circuit, advancing a control signal results in advancing of the read data which is useful for certain data read operations, as will be described in more detail below.

On the other hand, the clock timing adjust circuit may generate an internal control signal that is delayed by one or more clock cycles, by adding one or more clock cycles based on the predetermined timing latency. Delaying a control signal by one or more clock cycles introduces one or more additional clock cycles to the internal signal path of a clocked integrated circuit. In a clocked memory circuit, delaying a control signal results in delaying of the data which is useful for certain data write operations, as will be described in more detail below.

In embodiments of the present invention, the clock timing adjust circuit of the present invention can be advantageously applied in memory circuits such as Dynamic Random Access Memories (DRAM), NAND Flash memories, or in logic circuits such as microprocessors. In the following description, applications of the clock timing adjust circuit of the present invention in a memory device and in a microprocessor device are described with specific implementation details provided for the synchronous memory circuit. However, one of ordinary skill in the art would appreciate that the clock timing adjust circuit of the present invention can be applied to any clocked or synchronous integrated circuit to adjust clock timing to avoid collision due to on-chip timing signal latency. In particular, the clock timing adjust circuit of the present invention can be applied to any clocked or synchronous integrated circuit having an on-chip memory element for adjusting the clock timing of the control signals for accessing the on-chip memory element. The on-chip memory element may be an on-chip memory array or a register or a bank of registers.

In the present description, a clocked integrated circuit or a clock controlled integrated circuit refers to a semiconductor integrated circuit having circuits that are driven by a clock signal. Clocked integrated circuits are sometimes referred to as synchronous integrated circuits. An input clock is provided to the synchronous semiconductor integrated circuits and internal circuits of the integrated circuits are driven by the input clock or a derivative of the input clock. Examples of clocked integrated circuits include clocked synchronous memory devices and clocked or synchronous microprocessor devices. A clocked integrated circuit is usually coupled to a clock based external system which accesses the clocked integrated circuit synchronously, or based on clock cycles.

Furthermore, in the present description, a command signal is provided to an integrated circuit to cause the integrated circuit to perform functions supported by the integrated circuit. In the present description, a command signal is distinguished from an address signal which specifies the location in the integrated circuit where the function is to be applied. A command signal is also distinguished from a data signal which provides the data value for the function to be applied. The command signal is received by the integrated circuit to generate internal control signals to control the circuitry of the integrated circuit. In embodiments of the present invention, the clocked integrated circuit receives command signals to access a memory element of the clocked integrated circuit. Also, in some embodiments, the command signals can include a Read command signal and a Write command signal.

FIG. 1 is a block diagram of a synchronous memory device in which the clock timing adjust circuit can be incorporated in exemplary embodiments of the present invention. A generalized architecture for a synchronous memory device 10 is shown in FIG. 1 to illustrate the use of the clock timing adjust circuit of the present invention in a memory circuit. The synchronous memory device 10 may include additional components not shown in FIG. 1 to complete the memory circuit. Furthermore, the memory architecture shown in FIG. 1 is illustrative only and it will be appreciated that the clock timing adjust circuit and method described herein may be utilized in other memory architectures. In some examples, the synchronous memory device 10 may be constructed a DRAM, SRAM, Flash memory or other types of volatile or non-volatile memories.

Referring to FIG. 1, the synchronous memory device 10 includes a two-dimensional array 12 of memory cells 14. The memory cells 14 in the array 12 are accessed by word lines (rows) and bit lines (columns). The cell array 12 is addressed by a row decoder 18 and a column decoder 20 to selectively access the memory cells 14 in array 12 for read and write operations. In particular, an address ADDR is received at a control circuit 16 and the received address is decoded by the row decoder 18 which selects the word lines and by the column decoder 20 which selects the bit lines of the memory array 12. The row decoder 18 selectively activates a word line and the column decoder selectively activates a bit line to allow a memory cell 14 at the intersection of the selected word line and selected bit line to be accessed.

The synchronous memory device 10 also receives a command signal to control the operation of the memory device. The command signal is received by the control circuit 16 which in turn generates one or more control signals based on the command signal. The command signal can include a Read command signal to read data from the memory array or a Write command signal to write data to the memory array. The synchronous memory device 10 may also receive other command signals to support the operation of the memory device. As a synchronous or clocked device, the synchronous memory device 10 also receives an input clock signal CLK having a given clock frequency at the control circuit. The control circuit generates internal clock signals based on the input clock signal CLK to control the operations of the memory circuit.

To read data from the clocked memory circuit, read data from the selected memory cell of the memory array 12 is sensed by the sense amplifier 24 and the I/O-gating circuit 22 connects the selected bit lines to a Read FIFO 26 where the read data is stored. As a clocked memory device, the Read FIFO 26 is controlled by a clock signal $CLK2_R$ which is the same as the input clock signal CLK or is derived from the input clock signal CLK. In response to the clock signal $CLK2_R$, read data is provided to an output buffer 28 to be provided as an output data DOUT to circuits and systems external to the synchronous memory device 10.

To write data into the clocked memory circuit, write data DIN from external circuits and systems is received by the synchronous memory device 10 and more specifically, received by an input buffer 30. The write data DIN is then transferred to a Write FIFO 32 which is controlled by the clock signal $CLK2_W$. In response to the clock signal $CLK2_W$, write data is latched from the input buffer 30 into the Write FIFO 32 and is also read out of Write FIFO 32. The write data from Write FIFO 32 is provided to write driver circuits. The write driver circuits drive the write data through the I/O-gating circuit 22 onto the selected bit line to cause the data to be stored in the selected memory cell 14.

According to embodiments of the present invention, a clock timing adjust circuit 80 is incorporated in the synchronous memory device 10 to generate timing-adjusted control signals to access the memory array. In particular, the clock timing adjust circuit 80 receives the input clock signal CLK from the control circuit 16 and also receives the command signal, such as the Read command and the Write command from the control circuit 16. The clock timing adjust circuit 80 generates timing-adjusted internal control signals, such as L-Read for the Read command and L-Write for the Write command based on the detected input clock frequency, as will be described in more details below. The timing adjusted control signals L-Read and L-Write are coupled to the memory array 12 to control the read and write operations of the memory array 12.

In some embodiments, the clock timing adjust circuit 80 can be formed as part of the control circuit 16. The exact configuration of the clock timing adjust circuit 80 in the synchronous memory device 10 is not critical to the practice of the present invention. It is only necessary that the clock timing adjust circuit 80 generates the timing adjusted control signals to operate the memory array with the desired timing adjustments.

Figure 2:
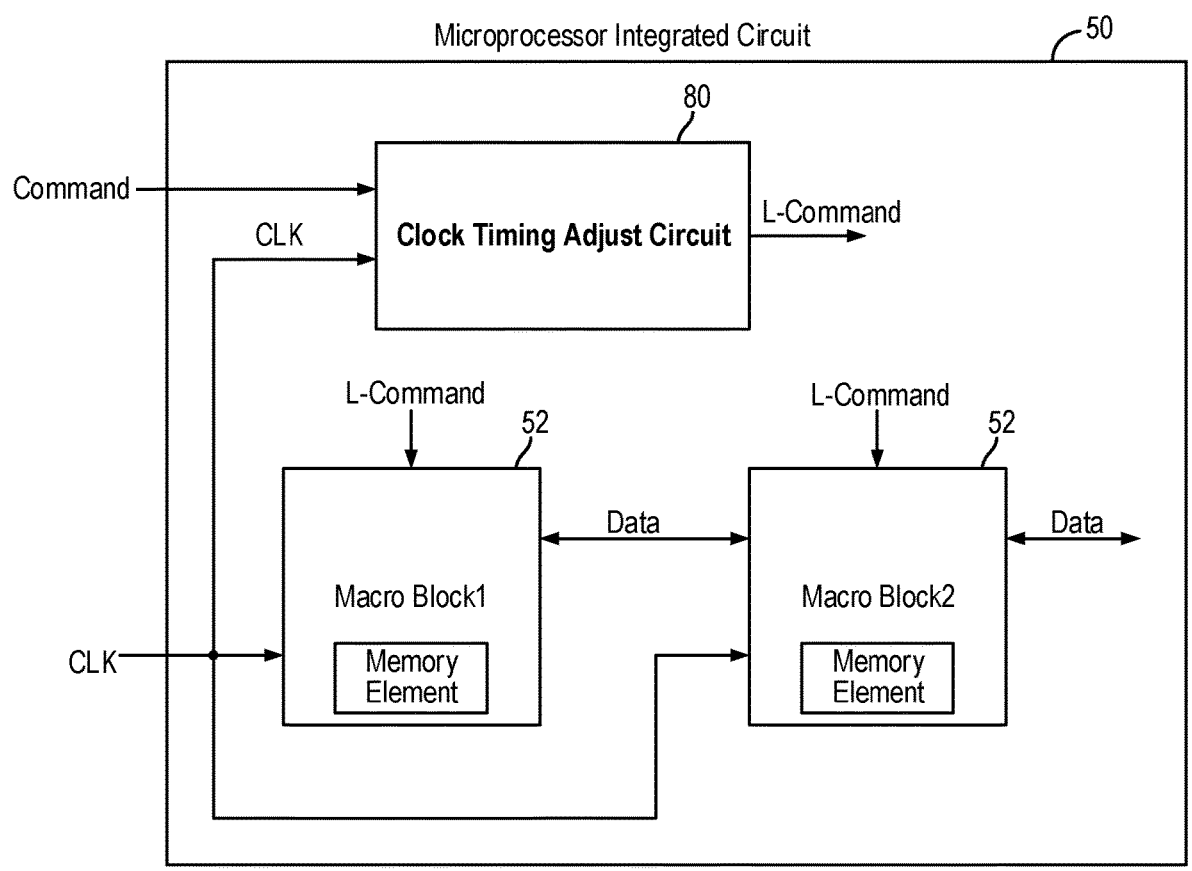
FIG. 2 is a block diagram of a microprocessor device in which the clock timing adjust circuit can be incorporated in exemplary embodiment of the present invention.

FIG. 2 is a block diagram of a microprocessor device in which the clock timing adjust circuit can be incorporated in exemplary embodiment of the present invention. Referring to FIG. 2, a microprocessor device or a microprocessor integrated circuit 50 includes various functional blocks 52, such as arithmetic logic unit (ALU), random access memory (RAM), shift registers, and level one storage (L1 cache). The functional blocks 52 are sometimes referred to as macro blocks. Many of these macro blocks 52 are clocked circuitry with the need to transfer data back and forth over large distances of silicon in the integrated circuit. Propagation delays in the data signal path may cause the data to arrive at the destination macro blocks outside of the expected clock cycles. Accordingly, in some embodiments, a clock timing adjust circuit 80 of the present invention is incorporated into the microprocessor device 50 to adjust the timing of the control signals used to transfer data between the functional blocks or macro blocks. For example, the clock timing adjust circuit 80 receives the input clock signal CLK to the microprocessor device 50 and also receives a command signal. The clock timing adjust circuit 80 generates a timing adjusted control signal L-command which can be used to control Macro Block 1 and/or Macro Block 2 to facilitate the transfer of data between the macro blocks within the microprocessor device. In some examples, the command signal is used to access a memory element in the macro blocks 52 and the command signal can be a Read command signal or a Write command signal.

The clock timing adjust circuit of the present invention can be incorporated in other logic circuits besides a microprocessor integrated circuit. The microprocessor integrated circuit of FIG. 2 is illustrative only and is not intended to be limiting.

Figure 3A:
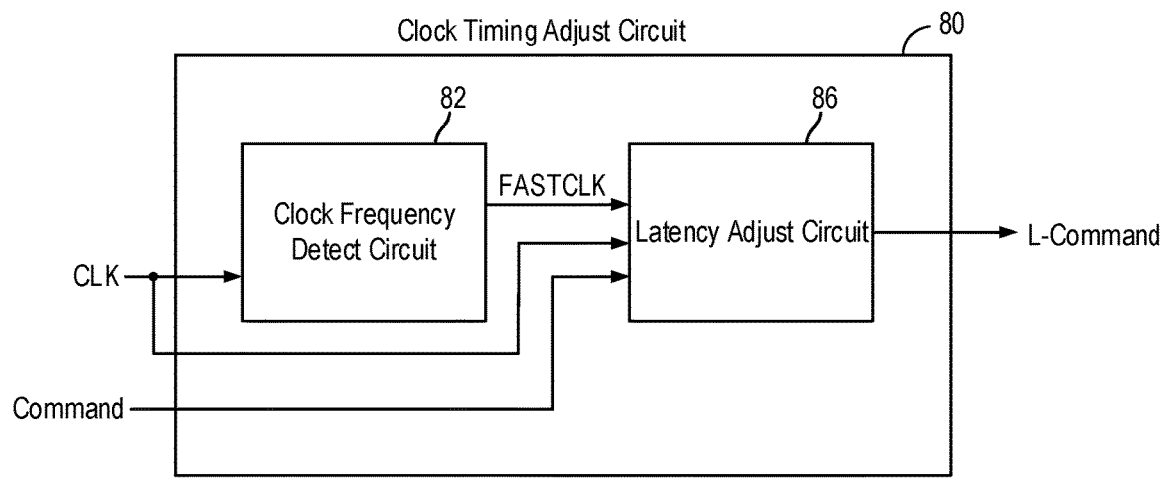
FIG. 3($a$) is a block diagram of a clock timing adjust circuit in some embodiments of the present invention.
Figure 3B:
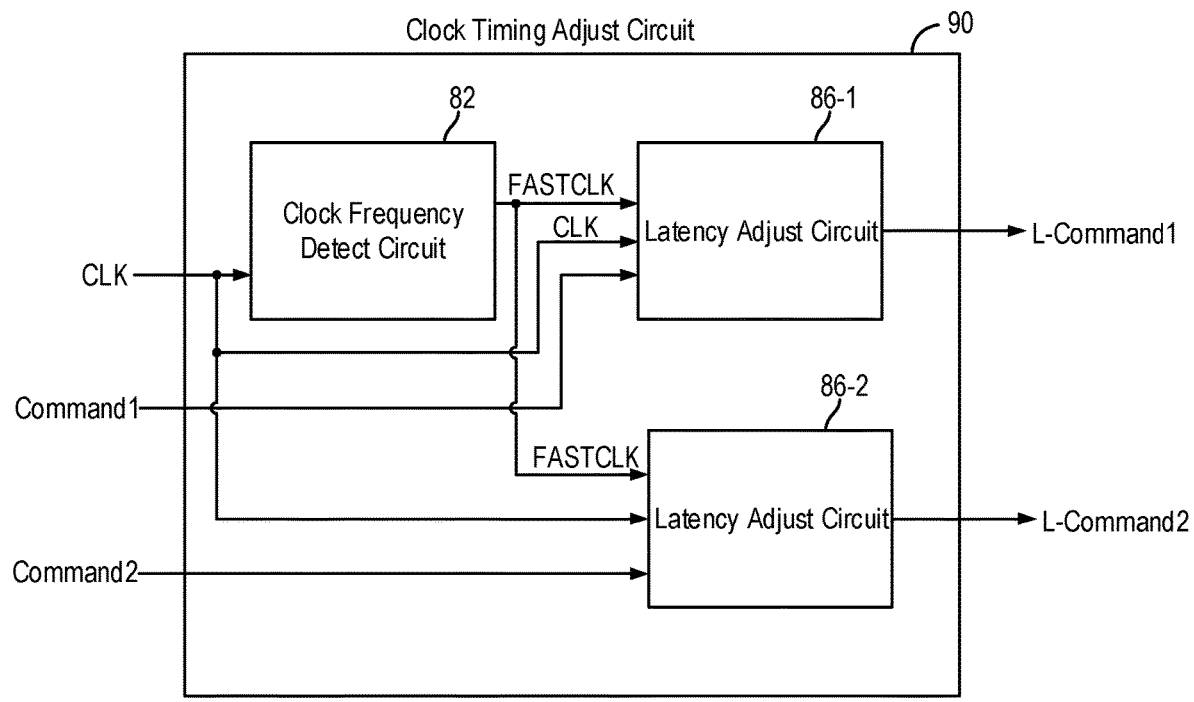

FIG. 3(*a*) is a block diagram of a clock timing adjust circuit in some embodiments of the present invention. Referring to FIG. 3(*a*), a clock timing adjust circuit 80 includes a clock frequency detect circuit 82 and a latency adjust circuit 86. The clock frequency detect circuit 82 receives the input clock signal CLK of the clocked integrated circuit and generates a clock detect output signal FASTCLK. The clock frequency detect circuit 82 detects the clock frequency of the input clock signal CLK to determine if the input clock signal CLK is above or below a predetermined frequency threshold. In the present description, a clock frequency above the frequency threshold is referred to as a high frequency clock while a clock frequency below the frequency threshold is referred to as a low frequency clock. For example, in one application, a high frequency clock is considered to be greater than 500 MHz. Thus, in one embodiment, the frequency threshold is 500 MHz. An input clock frequency of 500 MHz or above is considered a high clock frequency and an input clock frequency below 500 MHz is considered a low clock frequency. When the input clock frequency is equal to or greater than the frequency threshold, the clock frequency detect circuit 82 asserts the FASTCLK output signal to indicate a high clock frequency. Otherwise, the FASTCLK output signal is deasserted to indicate a low clock frequency.

The latency adjust circuit 86 receives the FASTCLK signal from the clock frequency detect circuit 82 and also the command signal received by the clocked integrated circuit and also the input clock signal CLK. The latency adjust circuit 86 generates an internal control signal L-Command based on the command signal and in response to the FASTCLK signal. In operation, the latency adjust circuit 86 is configured to add a given amount of timing latency to the command signal to generate the control signal L-Command. The amount of timing latency is given as the number of clock periods, or clock cycles, of the input clock signal and may represent the desired timing latency of the internal control signal in either the low frequency operation mode or the high frequency operation mode. That is, the predetermined amount of timing latency introduced by the latency adjust circuit 86 can have a latency value suitable for operating the clocked integrated circuit at a low clock frequency. Alternately, the predetermined amount of timing latency introduced by the latency adjust circuit 86 can have a latency value suitable for operating the clocked integrated circuit at a high clock frequency. Then, depending on the state of the FASTCLK signal, the latency adjust circuit 86 adjusts the timing latency by adding or removing clock cycles from the predetermined timing latency, thereby delaying or advancing the internal control signal L-Command.

In one example, the latency adjust circuit 86 does not apply timing adjustments when the FASTCLK signal is deasserted. Thus, the control signal L-Command is generated with the predetermined timing latency for low frequency operation. On the other hand, the latency adjust circuit 86 applies timing adjustments when the FASTCLK signal is asserted. Thus, the control signal L-Command is generated with the adjusted timing latency for high frequency operation. The timing adjustments can include advancing the control signal by one or more clock cycles relative to low frequency operation. The timing adjustments can also include delaying the control signal by one or more clock cycles relative to the low frequency operation. The timing adjusted control signal is then used to access the memory elements of the clocked integrated circuit. As thus configured, the timing adjusted control signal ensures that data signals being transferred within the clocked integrated circuit are captured at the correct time and collision events are avoided. In other examples, latency adjust circuit 86 can be configured to operate in the opposite regime where no timing adjustments are applied when the FASTCLK signal is asserted and timing adjustments are applied when the FASTCLK signal is deasserted.

A clocked integrated circuit often receives multiple command signals which will need to be time adjusted based on the input clock frequency to ensure proper circuit operation without collision events. For example, in a clocked integrated circuit including a memory element, the clocked integrated circuit may receive a Read command to read data from the memory element and a Write command to write data to the memory element. Accordingly, a clocked integrated circuit may include separate instances of the clock timing adjust circuit 80 for each command signal. That is, the clock timing adjust circuit 80 may be repeated for each command signal. In an alternate embodiment, the clock timing adjust circuit may be configured for multiple command signals using a shared clock frequency detect circuit. FIG. 3(*b*) is a block diagram of a clock timing adjust circuit in alternate embodiments of the present invention. Referring to FIG. 3(*b*), a clock timing adjust circuit 90 is configured to generate internal control signals for two command signals received by the integrated circuit—Command1 and Command2. The clock timing adjust circuit 90 is configured with a single clock frequency detect circuit 82 to generate the FASTCLK signal to indicate a low clock frequency or a high clock frequency. The clock timing adjust circuit 90 is configured with two instances of the latency adjust circuit 86-1 and 86-2. Each latency adjust circuit instance receives the FASTCLK signal, the input clock signal CLK and a respective command signal. The latency adjust circuit 86-1 generates the timing adjusted control signal L-Command1 and the latency adjust circuit 86-2 generates the timing adjusted control signal L-Command2.

In the case of multiple command signals, the configuration of the clock timing adjust circuit 90 of FIG. 3(*b*) provides advantages of simplified circuitry when the same frequency threshold can be applied to both command signals. In this case, a single clock frequency detect circuit 82 is needed to generate the FASTCLK signal to adjust the latency timing for multiple command signals. Each latency adjust circuit 86 may be provided with the same or different amount of timing latency and may be configured to add or remove clock cycles as a function of the command signal.

In other examples, a clocked integrated circuit may be configured with multiple instances of the clock timing adjust circuit 80 of FIG. 3(*a*) for multiple command signals. In this manner, it is possible to apply different frequency threshold to different command signals. For example, a Read command signal may be processed using a frequency threshold of 500 MHz while a Write command signal may be processed using a frequency threshold of 600 MHz. In that case, separate instances of the clock timing adjust circuit 80 are used for the Read command and the Write command signal and the clock frequency detect circuit 82 in each instance of the clock timing adjust circuit 80 is configured for the desired frequency threshold.

The clock timing adjust circuit of the present invention realizes many benefits over conventional collision avoidance methods used in clocked integrated circuits. First, the clock timing adjust circuit of the present invention can be advantageously applied in clocked or synchronous integrated circuits that are designed to operate over a wide range of input clock frequencies. The clock timing adjust circuit operates to adjust the internal control signal based on the input clock frequency to avoid collision events and to ensure valid operation over the entire input clock frequency range. Second, the use of the clock timing adjust circuit of the present invention in a clocked integrated circuit obviates the need to use extra deep FIFO/Output buffer circuit blocks to handle read data. The use of the clock timing adjust circuit of the present invention in a clocked integrated circuit also obviates the need to use extra deep FIFO/Input registers in the memory array to handle write data. The use of extra deep FIFO as output buffer or input registers is not desirable as it requires additional silicon area and increases the size of the integrated circuit, thereby increasing the cost of the integrated circuit. The clock timing adjust circuit of the present invention can be incorporated into a clocked integrated circuit to reduces cost and improves speed performance while reducing power consumption.

Figure 4:
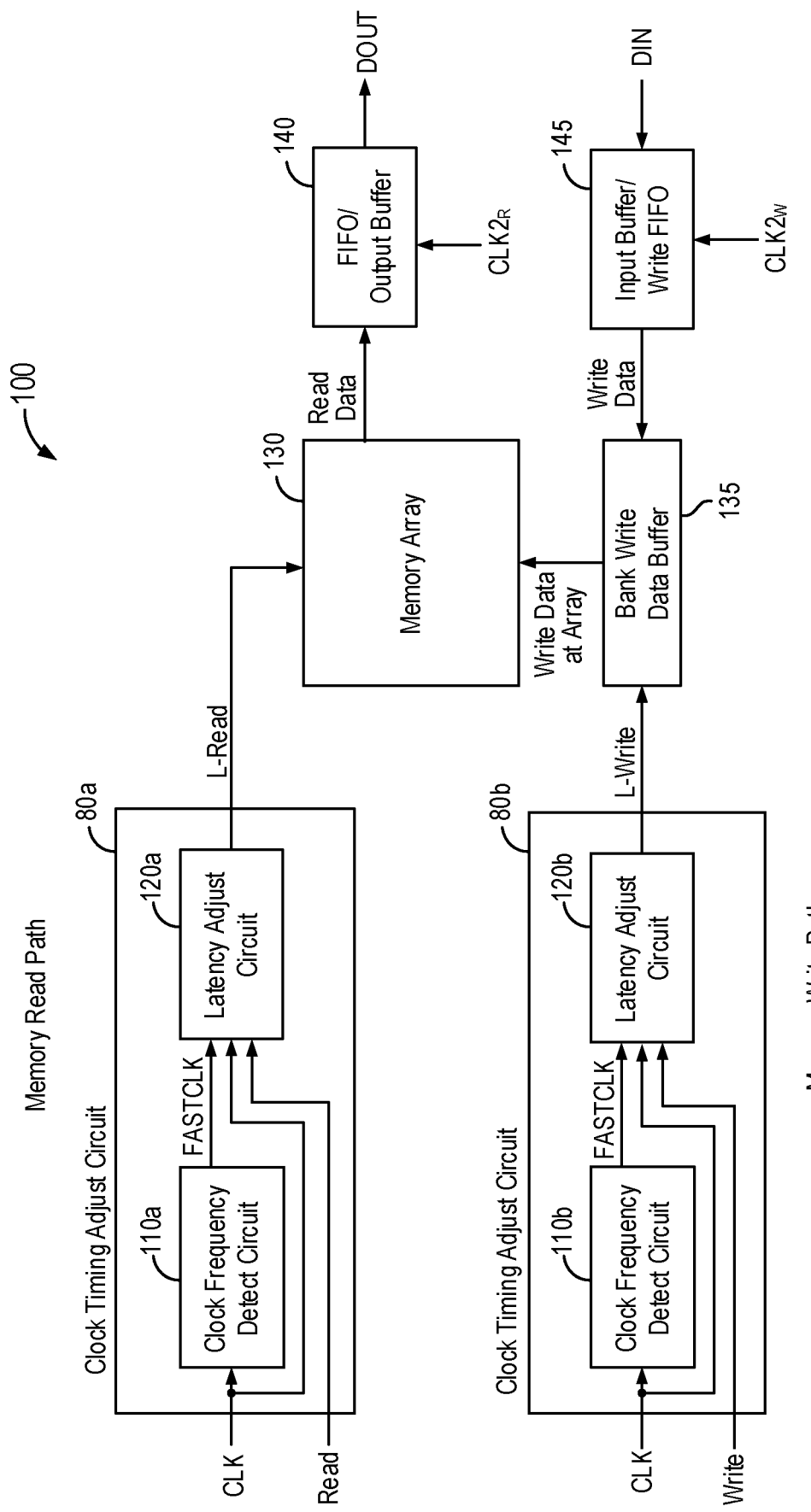
FIG. 4 is a block diagram illustrating a read path and a write path of a synchronous memory device incorporating the clock timing adjust circuit in embodiments of the present invention.

FIG. 4 is a block diagram illustrating a read path and a write path of a synchronous memory device incorporating the clock timing adjust circuit in embodiments of the present invention. Referring to FIG. 4, a synchronous memory device 100 includes a first instance 80a of the clock timing adjust circuit in the read path for the read command a second instance 80b of the clock timing adjust circuit in the write path for the write command. In the present embodiment, separate instances of the clock timing adjust circuit is used for the Read and Write command signals. In this manner, the same or different frequency thresholds may be used in each instance of the clock timing adjust circuit. In other embodiments, the clock timing adjust circuit 90 of FIG. 3(b) may be used where the Read and Write signal paths can share the same clock frequency detect circuit.

Referring to FIG. 4, in the read path, the clock timing adjust circuit 80a receives the input clock signal CLK which is the input clock or the system clock provided to the synchronous memory device 100. The clock timing adjust circuit 80a also receives the Read command provided to the synchronous memory device 100 when a read operation is desired. The input clock signal CLK is provided to the clock frequency detect circuit 110a which generates the FASTCLK signal. The FASTCLK signal and the Read command are then provided to the latency adjust circuit 120a to generate the timing adjusted control signal L-Read. The timing adjusted control signal L-Read is then used to access the memory array 130 in the read operation. The memory device 100 is assumed to have received an address signal ADDR for selecting a memory location in memory array 130 for which the data is to be read out. Under the control of the timing adjusted control signal L-Read, the memory array 130 provides the read data from a selected memory cell and read data is provided to a first-in-first-output FIFO/output buffer circuit 140 containing a Read FIFO. The FIFO/output buffer circuit 140 provides the read out data DOUT as an output signal of the synchronous memory device 100. The Read FIFO in the FIFO/output buffer circuit 140 is controlled by a clock signal $CLK2_R$ which is the input clock signal CLK or derived from the input clock signal CLK.

In embodiments of the present invention, the clock timing adjust circuit 80a is applied to advance the timing adjusted control signal L-Read by one or more clock cycles in response to the input clock signal CLK having a high clock frequency. In some embodiments, the clock frequency detect circuit 110a determines the input clock signal CLK as having a high clock frequency when the input clock signal CLK has a clock frequency above a predetermined frequency threshold and asserts the FASTCLK signal. When the input clock frequency is determined to be a high clock frequency, the latency adjust circuit 120a adjusts the timing latency of the control signal L-Read by removing one or more clock cycles so that the control signal L-Read is advanced by the one or more clock cycles. In this manner, the memory array 130 is controlled to provide the read data in one or more clock cycles earlier in high frequency operation so that the read data can reach the FIFO/output buffer 140 early enough to be latched into the Read FIFO by the clock signal $CLK2_R$ at the desired read latency time, usually specified by a system coupled to the memory device to access data stored on the memory device.

On the other hand, when the input clock has a low clock frequency, that is a clock frequency below the frequency threshold, the clock frequency detect circuit 110a does not assert the FASTCLK signal and the latency adjust circuit 120a generates the control signal L-Read without adjusting the timing latency. In this manner, the read data will arrive at the FIFO/output buffer 140 at the desired time and be latched into the Read FIFO and sent out to the output data pad by the clock signal $CLK2_R$ at the desired read latency time.

In the write path, the clock timing adjust circuit 80b receives the input clock signal CLK and also receives the Write command provided to the synchronous memory device 100 when a write operation is desired. The input clock signal CLK is provided to the clock frequency detect circuit 110b which generates the FASTCLK signal in the same manner as described above with reference to clock timing adjust circuit 80a. The FASTCLK signal and the Write command are then provided to the latency adjust circuit 120b to generate the timing adjusted control signal L-Write. The timing adjusted control signal L-Write is then used to control the memory array 130 in the write operation. For example, the timing adjusted control signal L-Write is used to control a bank write data buffer 135. In particular, the memory array 130 is usually divided into multiple banks of memory cells and each bank of memory cells may have associated with it a bank write data buffer to store the write data for that memory bank. In the present illustration, the control signal L-Write is coupled to control the bank write data buffer 135 to provide the write data to the memory array 130 to be written to the selected memory cell. The memory device 100 is assumed to have received an address signal ADDR for selecting a memory location in memory array 130 for which the data is to be written to. The memory device 100 is also assumed to have received input data DIN to be written to the memory location specified by the address signal. In a write operation, the synchronous memory device 100 receives the input data DIN of data to be written to the memory location specified by the address signal ADDR. The input data DIN is stored in an input buffer/FIFO circuit 145 containing a Write FIFO. The Write FIFO in the input buffer/FIFO circuit 145 is controlled by a clock signal $CLK2_W$ which could be the input clock signal CLK or derived from the input clock signal CLK. The input data stored in the Write FIFO is latched out of the FIFO and provided to the bank write data buffer 135 in response to the clock signal CLK2$_W$. Under the control of the timing adjusted control signal L-Write, the write data stored in the bank write data buffer 135 is written into the selected memory cell.

In embodiments of the present invention, the clock timing adjust circuit 80*b* is applied to delay the timing adjusted control signal L-Write by one or more clock cycles in response to the input clock signal CLK having a high clock frequency. In some embodiments, the clock frequency detect circuit 110*b* determines the input clock signal CLK as having a high clock frequency when the input clock signal CLK has a clock frequency above a predetermined frequency threshold and asserts the FASTCLK signal. When the input clock frequency is determined to be a high clock frequency, the latency adjust circuit 120*b* adjusts the timing of the control signal L-Write by adding one or more clock cycles so that the control signal L-Write is delayed by the one or more clock cycles. In this manner, the control signal L-Write is delayed during high clock frequency so that the write data has time to arrive at the bank write data buffer 135 before the control L-Write is asserted.

On the other hand, when the input clock has a low clock frequency, that is a clock frequency below the predetermined frequency threshold, the clock frequency detect circuit 110*b* does not assert the FASTCLK signal and the latency adjust circuit 120*b* generates the control signal L-Write without adjusting the timing latency. At low clock frequency, the write data arrives at the bank write data buffer 135 at a time that matches up with the control signal L-Write so that the correct write data is written into the memory array 130.

Figure 5:
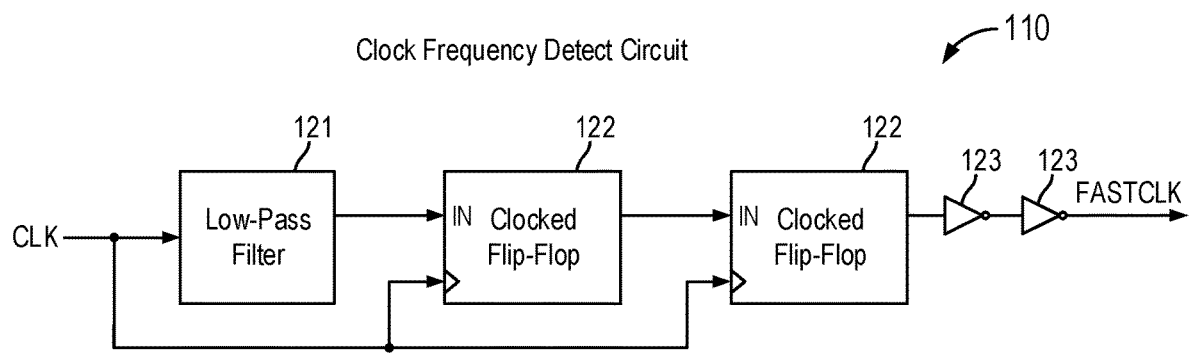
FIG. 5 is a block diagram illustrating the clock frequency detect circuit of the clock timing adjust circuit in embodiments of the present invention.

FIG. 5 is a block diagram illustrating the clock frequency detect circuit of the clock timing adjust circuit in embodiments of the present invention. Referring to FIG. 5, a clock frequency detect circuit 110 includes a low-pass filter 121 configured to receive the input clock signal CLK and one or more clocked flip-flop circuits 122 configured to generate the output signal FASTCLK. The clock flip-flop circuits 122 are controlled by the input clock signal CLK. The clock frequency detect circuit 110 may further include one or more inverters 123 as buffers or drivers for the output signal FASTCLK. The inverters 123 may be omitted in other embodiments of the clock frequency detect circuit.

In embodiments of the present invention, the clock frequency detect circuit 110 uses the low pass filter 121 to detect the clock speed or the clock frequency. The low pass filter 121 is configured to allow slow speed clock frequency signals to pass through while blocking or filtering out high speed clock frequency signals. The low-pass filtered clock signal is then captured or latched by the clocked flip-flop stages 122. The clocked flip-lop circuits 122 generate the output signal FASTCLK having a logical high value in response to a detected high clock frequency or having a logical low value in response to a detected low clock frequency.

In some embodiments, the low-pass filter 121 is configured to have a predetermined frequency value as the frequency detection threshold. The low-pass filter 121 enables detection of clock signals above the predetermined frequency threshold as having a high clock frequency or high clock speed. The low-pass filter 121 enables detection of clock signals below the predetermined frequency threshold as having a low clock frequency or low clock speed. In some embodiments, the low-pass filter circuit 121 is implemented as a RC low-pass filter circuit.

Figure 6:
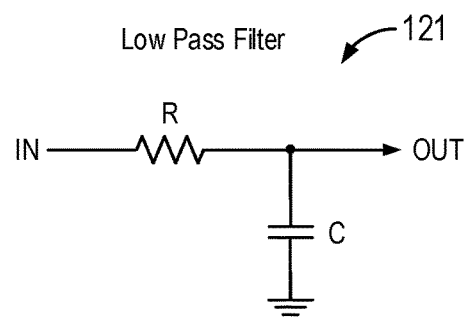
FIG. 6 is a circuit diagram illustrating a RC low-pass filter circuit which can be incorporated in the clock frequency detect circuit of the clock timing adjust circuit in embodiments of the present invention.

FIG. 6 is a circuit diagram illustrating a RC low-pass filter circuit which can be incorporated in the clock frequency detect circuit of the clock timing adjust circuit in embodiments of the present invention. Referring to FIG. 6, the low-pass filter 121 is implemented as a RC circuit includes a resistor R connected between the input terminal IN and the output terminal OUT and a capacitor C connected from the output terminal OUT to ground. In some embodiments, the resistor R could be implemented not only as a resistor element but also using other available devices that give an effective resistance such as an NMOS transistor whose gate is tied higher than the NMOS threshold voltage. Similarly, the capacitor C could be implemented with devices other than a capacitor element such as a MIM (metal-insulator-metal) capacitor or a MOS (metal-oxide-silicon) capacitor. The input clock signal CLK is provided to the input terminal IN and the common node between the resistor R and the capacitor C provides the low-pass filtered output signal. As thus configured, the threshold frequency for the low-pass filter 121 is determined by the resistance and capacitance of the resistor and capacitor of the RC circuit. The resistance or capacitance of the RC circuit can be adjusted to set the desired frequency threshold for the frequency detection in the clock frequency detect circuit 110. In particular, the frequency threshold of the RC low-pass filter 121 determines the frequency at which the output signal FASTCLK will be asserted (logical high).

In the present embodiment, an input clock signal having a clock frequency higher than the threshold frequency will be filtered out by the low-pass filter 121. The clocked flip-flop circuits 122 will then latch a logical high signal and the output signal FASTCLK having a logical high value will be generated, indicating a high clock frequency. On the other hand, an input clock signal having a clock frequency lower than the threshold frequency will pass through the low-pass filter 121. The clocked flip-flop circuits 122 will latch a logical low signal and the output signal FASTCLK having a logical low value will be generated, indicating a low clock frequency.

Figure 7:
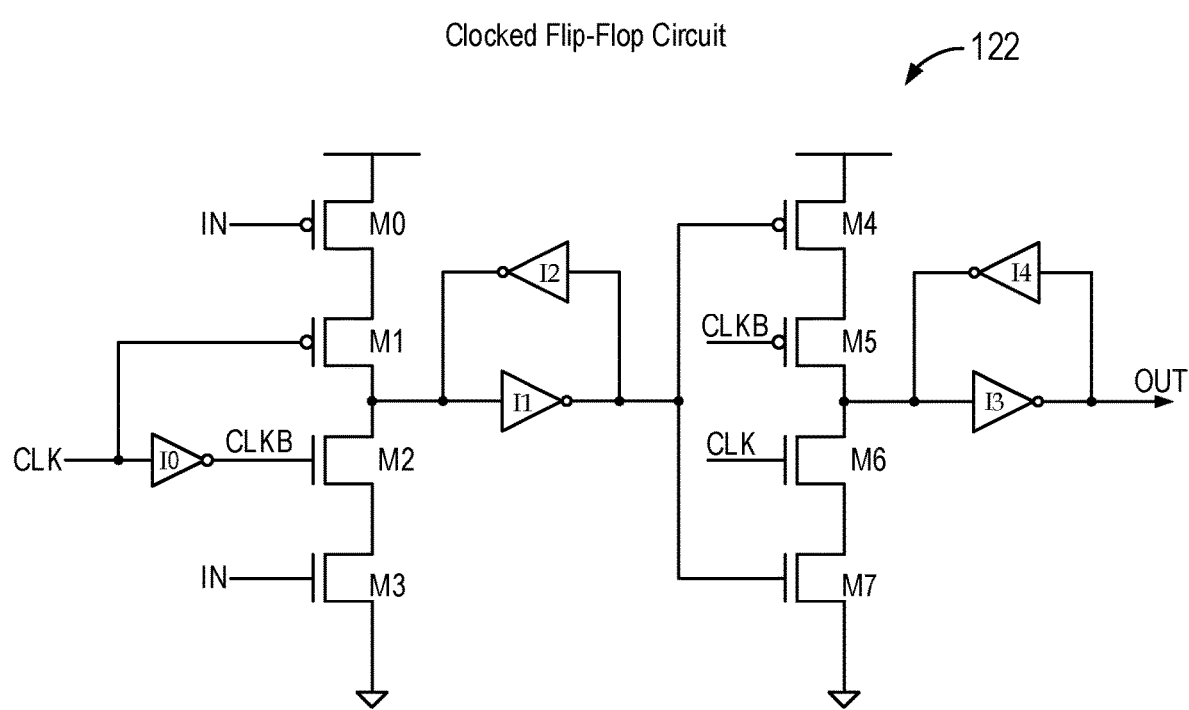
FIG. 7 is a circuit diagram illustrating a clocked flip-flop circuit which can be incorporated in the clock timing adjust circuit in embodiments of the present invention.

FIG. 7 is a circuit diagram illustrating a clocked flip-flop circuit which can be incorporated in the clock timing adjust circuit in embodiments of the present invention. In embodiments of the present invention, the clock flip-flop circuit 122 can be incorporated in the clock frequency detect circuit 110 and the latency adjust circuit 120. Referring to FIG. 7, a clocked flip-flop circuit 122 has an input terminal IN receiving an input data to be latched and a clock input terminal receiving a clock signal. The clocked flip-flop circuit 122 includes an input stage formed by transistors M0 to M3, inverters I0 to I4 and an output stage formed by transistors M4 to M7.

In operation, the clocked flip-flop circuit 122 passes the input data on the input terminal IN at the first pair of back-to-back inverter I1 and I2 when the input clock is at a logical low. Then, when the input clock transitions to a logical high, data latched and stored at inverters I1 and I2 is passed to the second pair of back-to-back inverter I3 and I4 and is provided as the output data OUT. It is understood that inverters I2 and I4 are typically weak in drive strength in comparison to the drive strength of transistors M0 to M7 so that the input stage and the output stage can drive the inverter latches. The clocked flip-flop circuit 122 shown in FIG. 7 is illustrative only and one of ordinary skill in the art would appreciate that other circuit implementation of a clock flip-flop circuit may be used. The exact construction of the clocked flip-flop circuit is not critical to the practice of the present invention.

Figure 8:
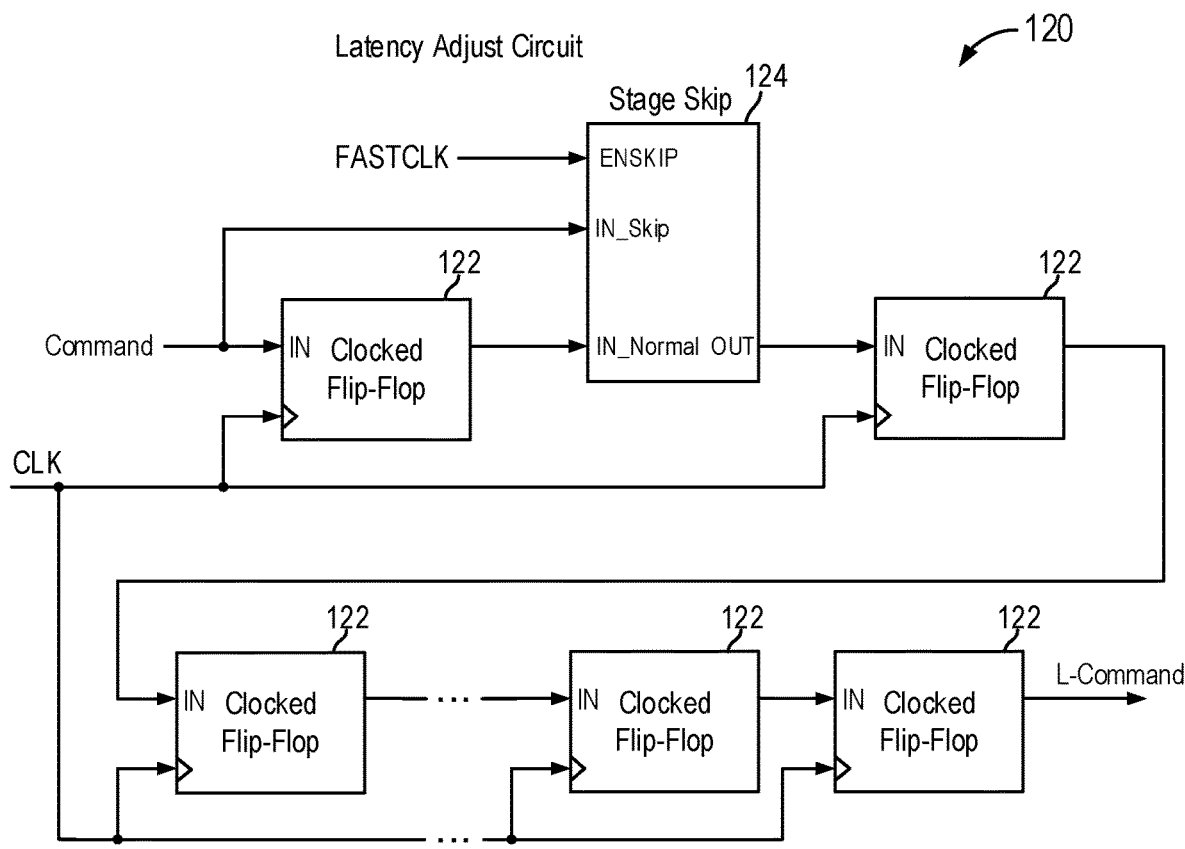
FIG. 8 is a circuit diagram illustrating the latency adjust circuit of the clock timing adjust circuit in embodiments of the present invention.

FIG. 8 is a circuit diagram illustrating the latency adjust circuit of the clock timing adjust circuit in embodiments of the present invention. Referring to FIG. 8, the latency adjust circuit 120 receives a command signal, such as a Read command or a Write command for a memory device, and shifts the command signal serially through a series of clock stages or delay stages. In the present embodiment, the clock stages are implemented as clocked flip-flop circuits 122 that are clocked by a clock signal, such as the input clock signal CLK. The number of clocked stages in the chain determines the desired timing latency to use for the command signal. The desired timing latency can be selected for high clock frequency operation or for low clock frequency operation. The command signal is shifted through the clocked stages 122 to generate the timing adjusted control signal L-Command, such as L-Read or L-Write. In the present embodiment, the clock stages 122 are implemented using the clocked flip-flop circuit of FIG. 7. In other embodiments, other clocked delay circuits can be used to implement the clock stages.

In one example, the number of clocked stages provides a timing latency required during low clock frequency operation. In another example, the number of clocked stages provides a timing latency required during high clock frequency operation. For example, an external system coupled to the clocked integrated circuit may specify a Read Latency time from the issuances of the Read command to the reading of the read data by the external system at the output of the clocked integrated circuit. The latency adjust circuit 120 may then be configured with a chain of clock stages selected to meet the Read Latency time requirement at low clock frequency operation.

In another example, an external system coupled to the clocked integrated circuit may specify a Write Latency time from the issuances of the Write command to providing the write data at the input pads of the clocked integrated circuit. The latency adjust circuit 120 may then be configured with a chain of clock stages selected to meet the Write Latency time requirement at low clock frequency operation.

In the present embodiment, the number of clocked stages used corresponds to the latency needed for low frequency operation of the clocked integrated circuit. The latency adjust circuit 120 also receives the FASTCLK signal from the clock frequency detect circuit 110. The FASTCLK signal is provided to a stage skip circuit 124 as the enable-skip ENSKIP signal. The stage skip circuit 124 is inserted in the series of clock stages 122. In the present embodiment, the stage skip circuit 124 is inserted to enable one clock stage to be skipped. In other embodiments, the latency adjust circuit 120 can be configured to enable two or more clock stages to be skipped, as will be explained in more details below. The circuit construction of the latency adjust circuit 120 of FIG. 8 is illustrative only and not intended to be limiting.

In operation, when the FASTCLK signal is asserted or at a logic high level, the stage skip circuit 124 is enabled to bypass one clocked flip-flop circuit 122. In this manner, the command signal, being shifted through the series of clocked flip-flop circuits 122, has bypassed one clock cycle delay. Therefore, the command signal is advanced by one clock cycle. The timing adjusted control signal L-Command will be asserted one clock cycle earlier than in low frequency operation. In the example of a memory read operation, providing the timing adjusted control signal L-Read one clock cycle earlier for high clock frequency results in providing the read data at the correct time for latching into the Read FIFO. The Read FIFO stores the read data in proper order to be buffered and driven externally from the synchronous memory circuit. At a high clock frequency, the internal control signal L-Read may not arrive in time to access the memory array. However, when a high clock frequency is detected by the clock frequency detect circuit 110, the latency adjust circuit 120 of the present invention advances the L-Read control signal so that the read data can be accessed earlier from the memory array and the read data can then arrive at the Read FIFO at the desired time for latching.

On the other hand, when the FASTCLK signal is deasserted or at a logic low level, the stage skip circuit 124 is not enabled and the clocked flip-flop circuit 122 is not bypassed. In this manner, the control signal L-Read is not advanced but rather goes through all the delay in the series of clocked flip-flop circuit 122. The control signal L-Read is asserted at the prescribed time in low frequency operation.

As described above, in other embodiments of the latency adjust circuit 120, the stage skip circuit 124 may be configured to bypass one or more clock stages 122 to provide the desired timing adjustment. In one example, the stage skip circuit 124 may be configured to bypass two clock stages 122 by placing the stage skip circuit 124 after two clocked flip-flop circuits 122.

In another embodiment, a multi-bit FASTCLK signal, such as FASTCLK<n:0>, can be generated by the clock frequency detect circuit 110. For example, the clock frequency detect circuit 110 can be implemented as multiple instances of the clock frequency detect circuit, with the low-pass filter of each instance being configured for a different frequency detection threshold. In one example, a set of slow, medium, fast and very fast frequency thresholds can be used. Each instance of the clock frequency detect circuit generates a respective FASTCLK signal, which all of the instances together form the FASTCLK<n:0> signal. Each bit of the FASTCLK<n:0> is then associated with a different number of clock stages to be skipped. For example, multiple instances of the stage skip circuit 124 may be used, with each instance being driven by a respective FASTCLK<n:0> signal.

In the above described embodiments, the latency adjust circuit 120 is described as being implemented to skip one or more clock stages. That is, the stage skip circuit 124 is normally disabled so that the full series of clock stages in the latency adjust circuit 120 is used in low frequency operation. When the FASTCLK signal is asserted, the stage skip circuit 124 is enabled to skip or remove one or more clock stages from the series of clock stages in the latency adjust circuit. In the present embodiment, the FASTCLK signal is provided to the enable skip ENSKIP input signal of the stage skip circuit 124.

In other embodiments of the present invention, the latency adjust circuit 120 can be configured to add one or more clock stages so that the timing adjusted command signal L-Command is delayed from the low frequency operation. Accordingly, latency adjust circuit 120 is configured with additional clock stages which are normally bypassed by the stage skip circuit 124. That is, in the alternate embodiment, the stage skip circuit 124 is normally enabled to bypass or skip the additional clock stages so that the latency adjust circuit 120 is operated with the remaining clock stages in low frequency operation. However, when the FASTCLK signal is asserted, the stage skip circuit 124 is disabled so that the additional clock stages become inserted in the series of clock stages. In this manner, the timing adjusted control signal L-Command will pass through additional clock stages, thereby the control signal L-Command will be delayed by additional clock cycles. In one embodiment, the latency adjust circuit 120 can be configured to add one or more clock stages by using an inverse of the FASTCLK signal to control the enable skip ENSKIP input signal of the stage skip circuit 124.

In other embodiments, the number of clocked stages used can be corresponding to the latency needed for high frequency operation of the clocked integrated circuit and the stage skip circuit 124 can be configured to skip or insert clock stages low clock frequency operation.

Figure 9:
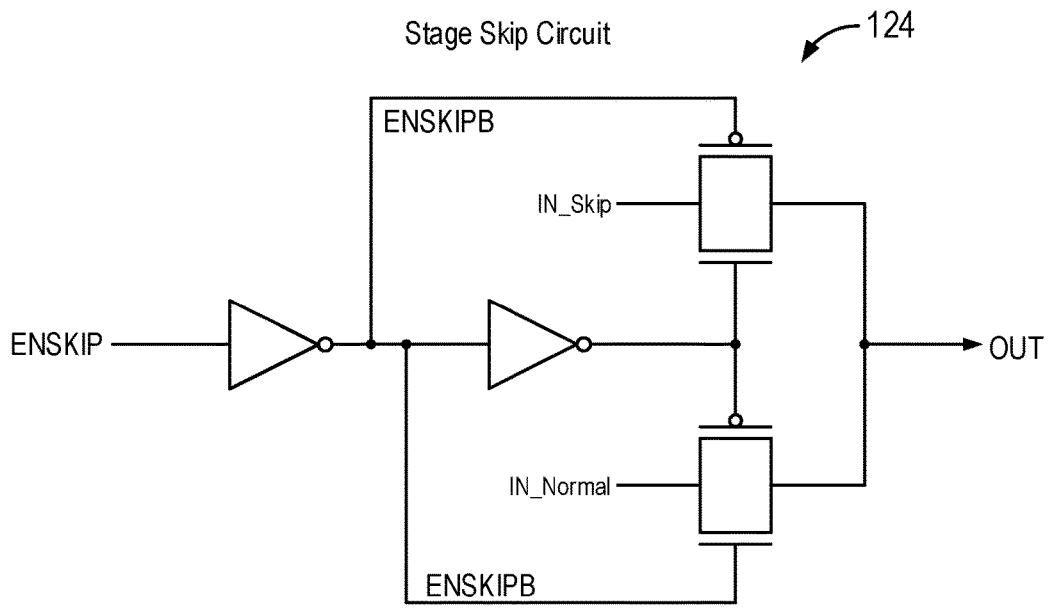
FIG. 9 is a circuit diagram illustrating the stage skip circuit of the latency array access start circuit in embodiments of the present invention.

FIG. 9 is a circuit diagram illustrating the stage skip circuit of the latency array access start circuit in embodiments of the present invention. Referring to FIG. 9, the stage skip circuit receives the enable skip input signal ENSKIP and an IN_SKIP signal which is connected to the input of a clock stage to be bypassed and an IN_NORMAL signal which is connected to the output of the clock stage to be bypassed. The enable skip input signal ENSKIP is configured to steer the signal IN_SKIP or the signal IN_NORMAL to the output terminal of the stage skip circuit 124.

In the event that the signal FASTCLK is provided as the enable skip input signal ENSKIP, the stage skip circuit 124 selects the IN_SKIP signal when the signal FASTCLK is asserted to remove one clock stage and the stage skip circuit 124 selects the IN_NORMAL signal when the signal FASTCLK is deasserted to use the full series of clock stages in normal operation.

In the event that the inverse of the signal FASTCLK is provided as the enable skip input signal ENSKIP, the stage skip circuit 124 selects the IN_NORMAL signal when the signal FASTCLK is asserted to add the additional clock stages to the series of clock stages and the stage skip circuit 124 selects the IN_SKIP signal when the signal FASTCLK is deasserted to remove the additional clock stages so that only the full series of clock stages in normal operation is used.

In the embodiment described in FIG. 8, the latency adjust circuit is configured to skip the first clock stage of the chain of clock stages. In other embodiments, the latency adjust circuit can be configured to skip any clock stage within the chain of clock stages. Alternately, the latency adjust circuit may be configured to add clock stages at any location along the chain of clock stages.

FIGS. 8 and 9 above illustrate one exemplary embodiment of the latency adjust circuit where the timing latency is introduced to the command signal using a chain of clock stages or delay stages and the timing latency is adjusted by adding or removing one or more clock stages. The use of a chain of clock stages or a delay chain to introduce the adjustable timing latency in the latency adjust circuit is illustrative only and is not intended to be limiting. In other embodiments, the latency adjust circuit may use a counter circuit to count the number of clock cycles and a select circuit generating a select signal in response to the FASTCLK signal to select the desire number of clock cycles. The command signal is then shifted by the selected number of clock cycles.

Figure 10:
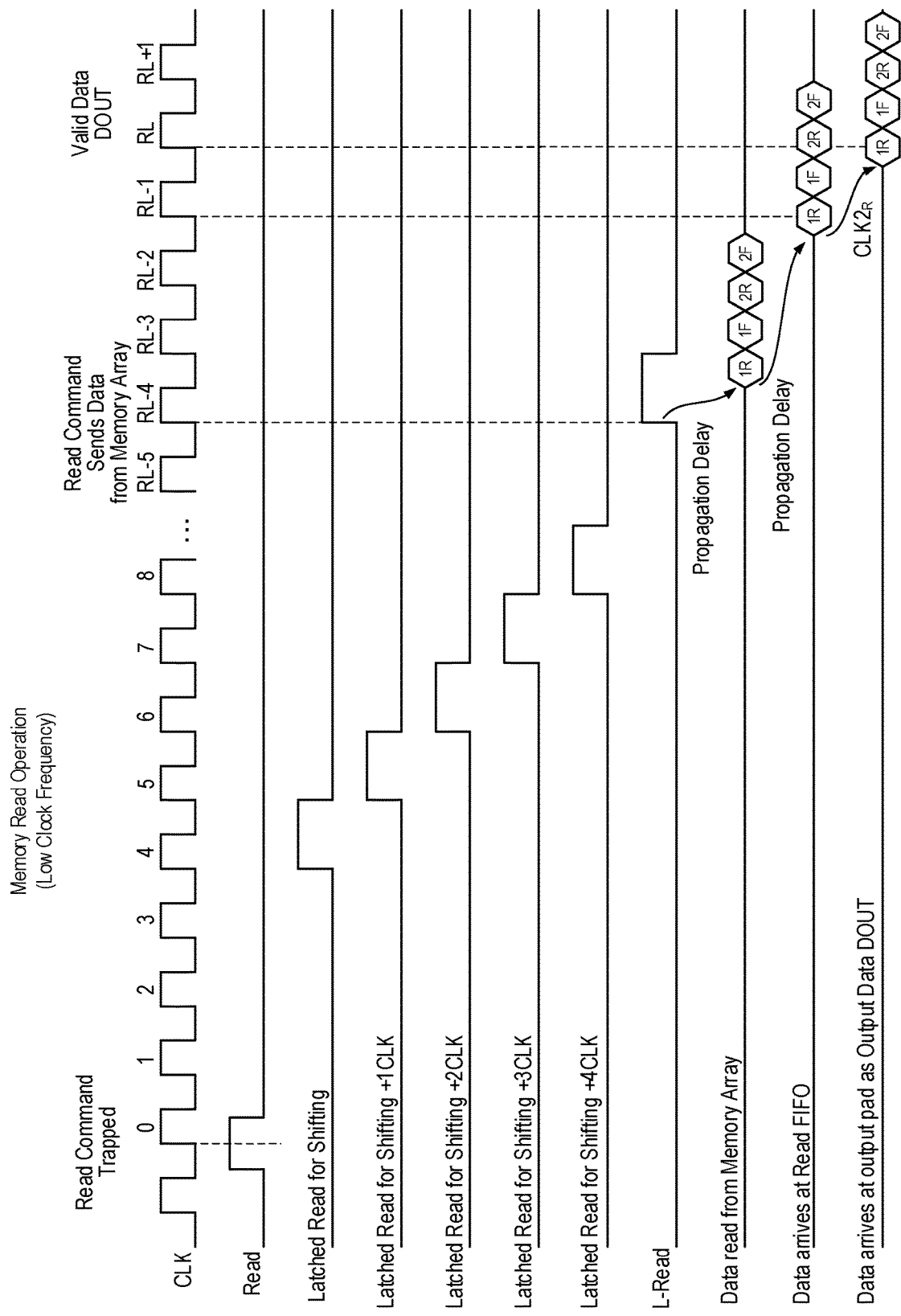
FIG. 10 is a timing diagram illustrating a read operation of a synchronous memory device in embodiments of the present invention.

FIG. 10 is a timing diagram illustrating a read operation of a synchronous memory device in embodiments of the present invention. The timing diagram of FIG. 10 illustrates the case where the read operation is performed with a low input clock frequency. In a read operation, the synchronous memory device receives a Read command signal at clock cycle 0 and valid read data is expected at a given number of clock cycles later, referred to as the Read Latency or the RL clock cycle. In the present example, the clock timing adjust circuit shifts the Read command through the chain of clock stages so that the control signal L-Read is asserted at the RL-4 clock cycle.

It is instructive to note that while the control signals of the synchronous memory device are generated based on the input clock, the memory array operates as an analog circuit and generates output signals with RC delay or propagation delay that are not based on the clock cycles of the input clock. Furthermore, the RC delay or propagation delay are not a function of the clock frequency. That is, as the clock frequency increases, the RC delay or propagation delay may remain the same and therefore becomes a larger portion or a larger number of the high frequency clock cycles, leading to possible collision events.

In the example shown in FIG. 10, with the assertion of the control signal L-Read, the memory array is accessed to read out data at the selected memory location. The delay from the assertion of the control signal L-Read to the generation of the read data from the memory array is an analog propagation delay not necessarily governed by clock cycles. The read data is then transported to the Read FIFO, after a certain propagation delay. Then under the control of the clock signal $CLK2_R$, the read data is read out of the FIFO to the output data pad as the output data DOUT. In this case, with the input clock running at a low clock frequency, the read data is available at the RL clock cycle and valid data is read out.

Figure 11:
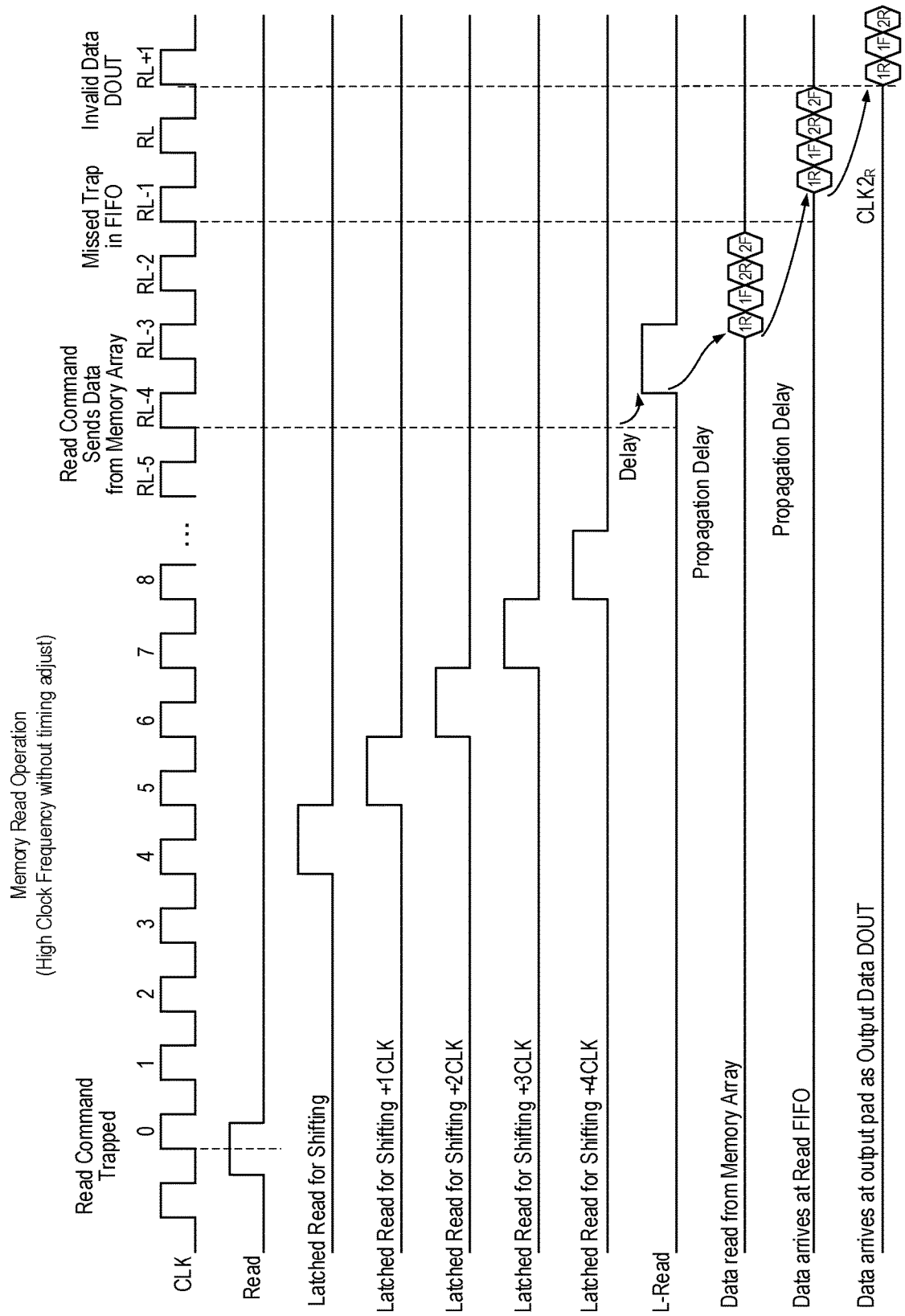
FIG. 11 is a timing diagram illustrating a read operation of a synchronous memory device at a high clock frequency and without timing latency adjustment in some examples.

FIG. 11 is a timing diagram illustrating a read operation of a synchronous memory device at a high clock frequency and without timing latency adjustment in some examples. The memory read operation proceeds in the same manner as described above with reference to FIG. 10. However, as the Read command signal is propagated through the latency clock chain, there is an inherent delay from the rising clock edge of the clock signal RL-4 to the rising edge of the control signal L-Read, denoted as "delay" in FIG. 11. This inherent delay is negligible when the clock frequency is low. However, when the clock frequency is high, this inherent delay becomes a large portion of the clock period. Therefore, with the delayed assertion of the control signal L-Read, the read out data from the memory array is also delayed so that the read out data does not arrive at the Read FIFO in time to be latched and read out at the Read Latency clock cycle RL. In the present illustration, the valid read out data will not arrive until one clock cycle after the RL clock cycle. However, because a receiving system expects to read out data from the memory device at clock cycle RL, invalid data is read out as the output data.

Figure 12:
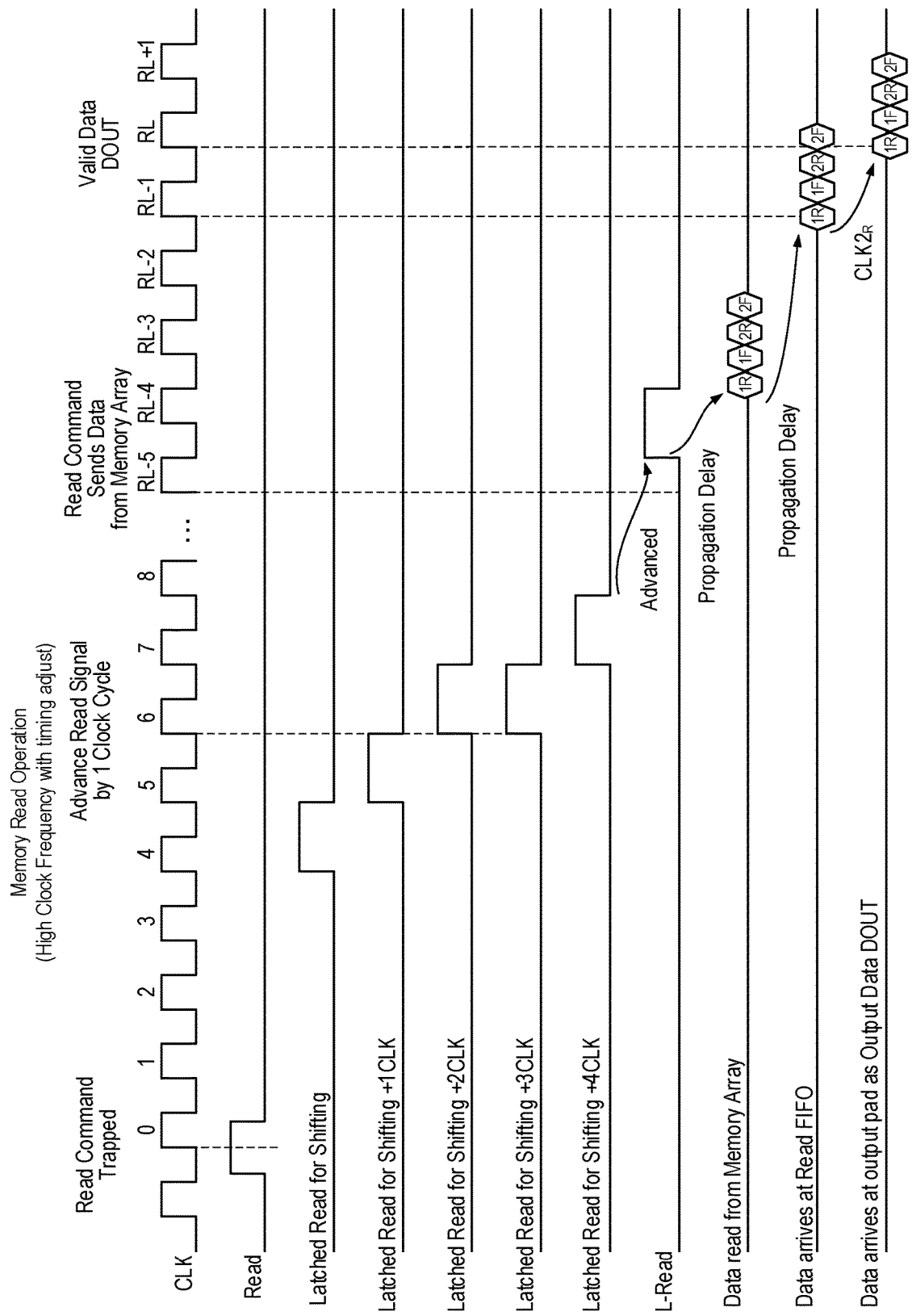
FIG. 12 is a timing diagram illustrating a read operation of a synchronous memory device at a high clock frequency and with the timing latency adjustment applied in embodiments of the present invention.

FIG. 12 is a timing diagram illustrating a read operation of a synchronous memory device at a high clock frequency and with the timing latency adjustment applied in embodiments of the present invention. In the memory read operation shown in FIG. 12, the clock timing adjust circuit detects the high input clock frequency and configures the latency adjust circuit to skip one or more clock cycles for the Read command. As shown in FIG. 12, the timing adjusted control signal L-Read is generated by skipping a clock cycle (for example, the +3 clock cycle) so that the control signal L-Read is asserted by the RL-5 clock cycle, ahead of the RL_4 clock cycle. Even with the assertion delay of the L-Read signal edge, the read out data is still able to be retrieved from the memory array, provided to the Read FIFO and then be available for read out as output data DOUT at the expected clock cycle RL. Accordingly, by adjusting the timing latency of the control signal L-Read, valid data can be read out even with a high input clock frequency.

Figure 13:
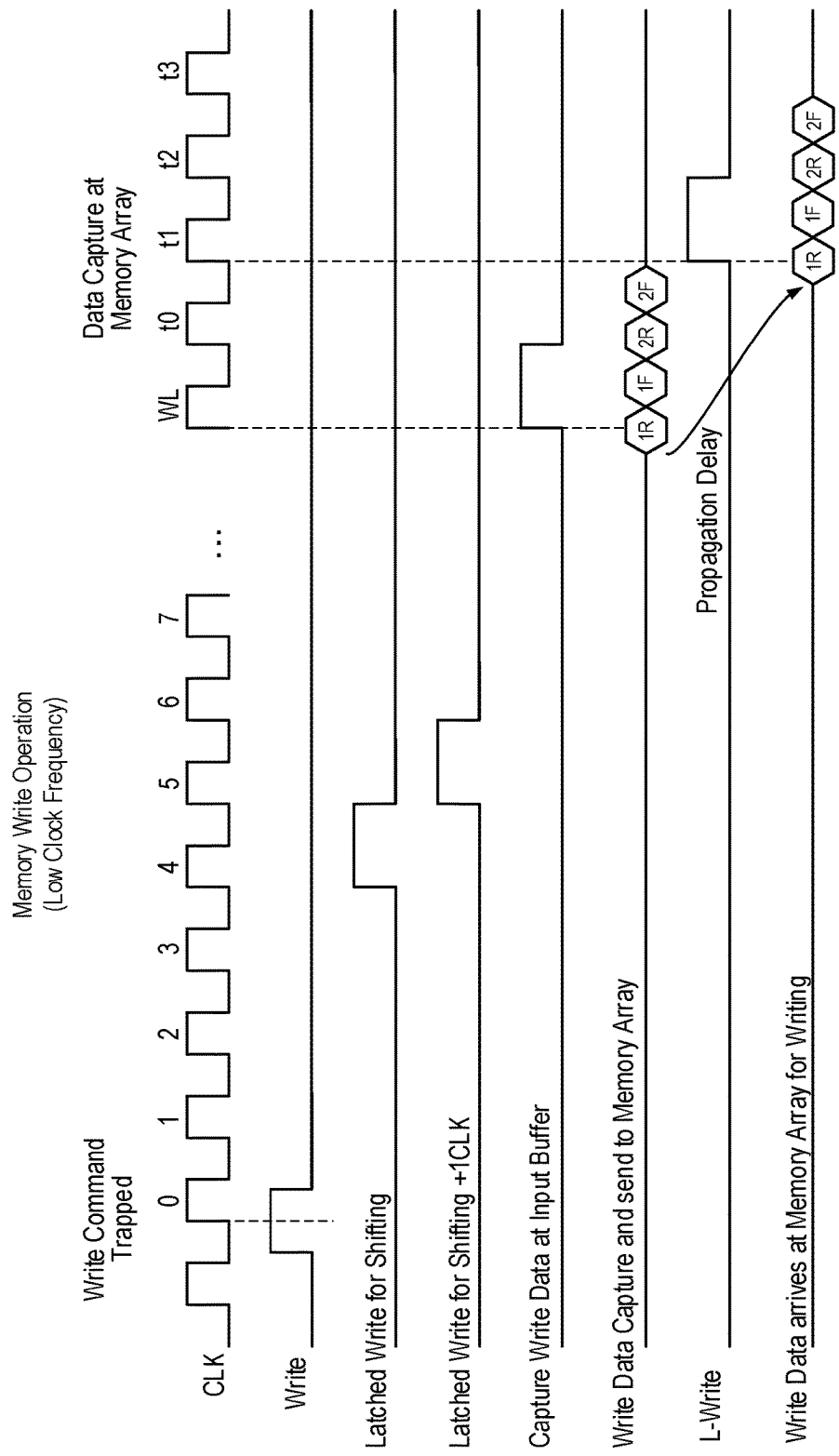
FIG. 13 is a timing diagram illustrating a write operation of a synchronous memory device in embodiments of the present invention.

FIG. 13 is a timing diagram illustrating a write operation of a synchronous memory device in embodiments of the present invention. The timing diagram of FIG. 13 illustrates the case where the write operation is performed with a low input clock frequency. In a write operation, the synchronous memory device receives a Write command signal at clock cycle 0 and valid write data is provided at a given number of clock cycles later, referred to as the Write Latency or the WL clock cycle. The write data is captured at the input buffer and then transferred to the memory array to be written into the selected memory cell. However, there is an analog propagation delay between the time the write data is captured at the input buffer and the time the write data is propagated to the memory array. This propagation delay is not based on the clock cycles and is not a function of the clock frequency. In the present example, the clock timing adjust circuit shifts the Write command through the chain of clock stages so that the control signal L-Write is asserted at clock cycle t1. At the low input clock frequency, the control signal L-Write arrives at the same time as the write data and valid write data is captured at the memory array.

Figure 14:
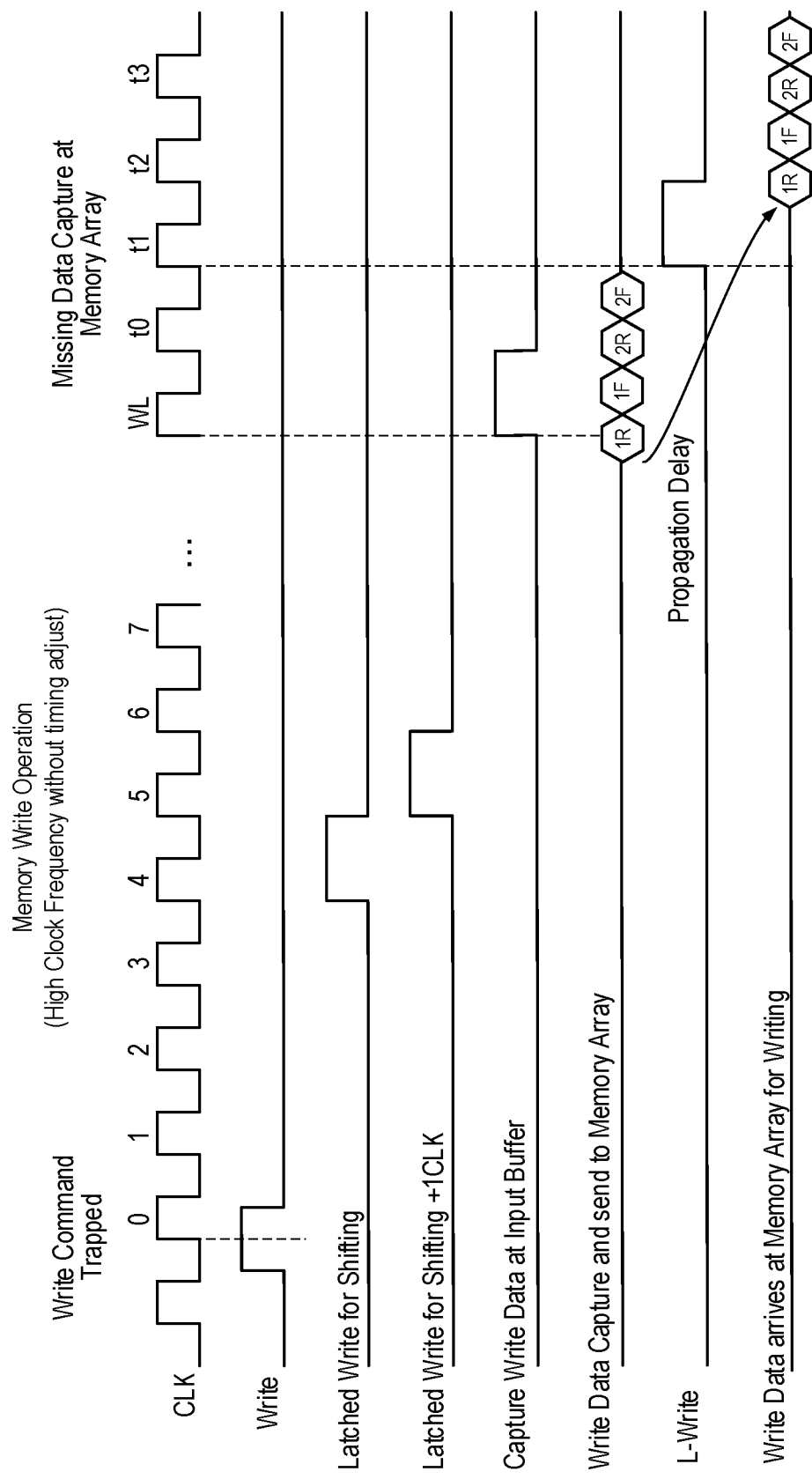
FIG. 14 is a timing diagram illustrating a write operation of a synchronous memory device at a high clock frequency and without timing latency adjustment in some example.

FIG. 14 is a timing diagram illustrating a write operation of a synchronous memory device at a high clock frequency and without timing latency adjustment in some example. The memory read operation proceeds in the same manner as described above with reference to FIG. 13. However, due to the propagation delay of the write data, when the control signal L-Write is asserted at clock cycle t1, the valid write data has not yet arrived at the memory array. Therefore, the valid write data is not captured by the control signal L-Write. Therefore, instead of the desired write data, invalid data is written to the memory array.

Figure 15:
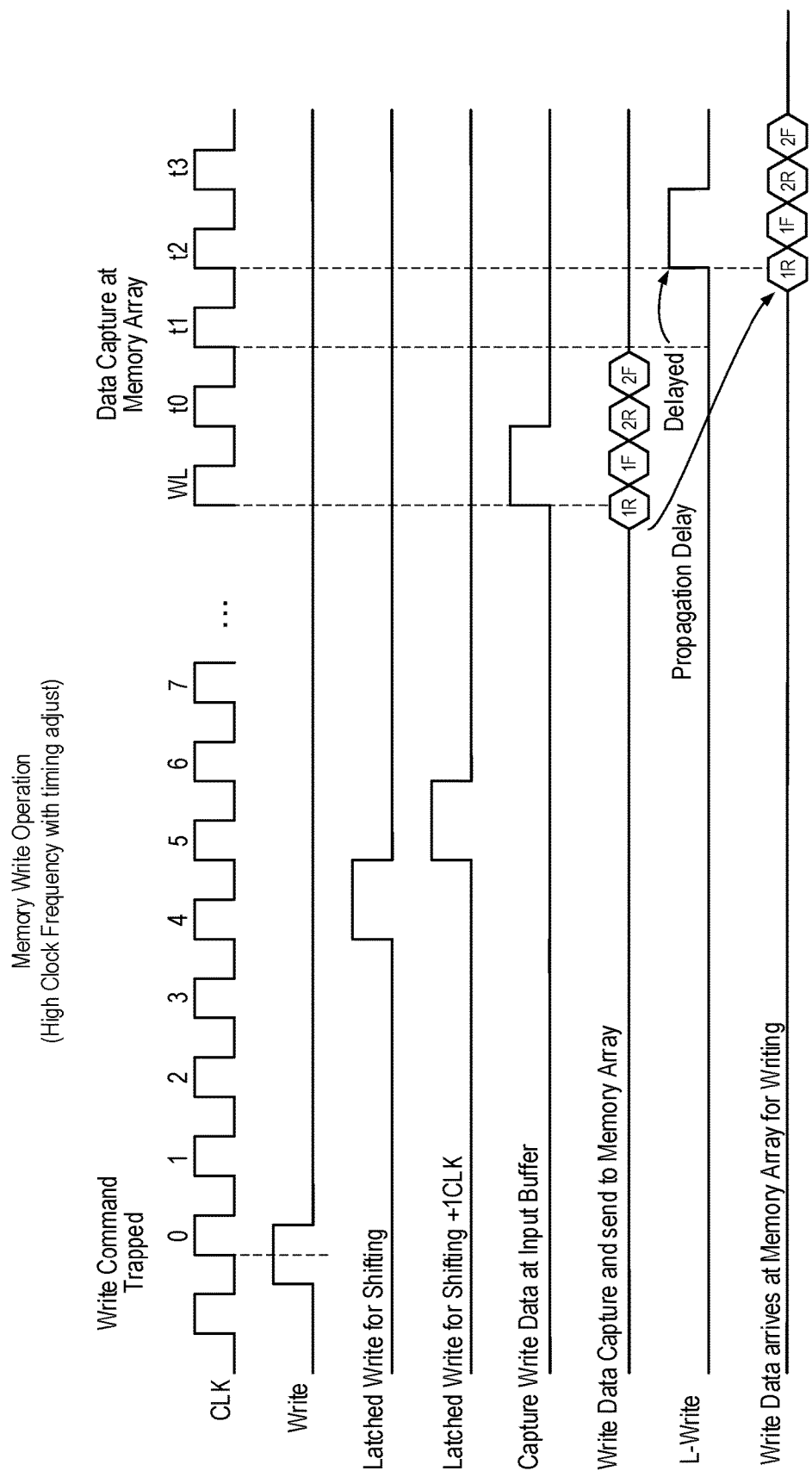
FIG. 15 is a timing diagram illustrating a write operation of a synchronous memory device at a high clock frequency and with the timing latency adjustment applied in embodiments of the present invention.

FIG. 15 is a timing diagram illustrating a write operation of a synchronous memory device at a high clock frequency and with the timing latency adjustment applied in embodiments of the present invention. In the memory write operation shown in FIG. 15, the clock timing adjust circuit detects the high input clock frequency and configures the latency adjust circuit to add one or more clock cycles for the Write command. Accordingly, the control signal L-Write is delayed by one clock cycle and is not asserted until clock cycle t2. In this manner, additional time is provided to allow the write data to reach the memory array. At clock cycle t2, the control signal L-Write is asserted when the valid write data has arrived at the memory array and a valid write operation is performed.

In the above described embodiments, the clock timing adjust circuit is configured to remove or skip clock stages for high frequency read operations in a synchronous memory device and is configured to add clock stages for high frequency write operations in a synchronous memory device. The operation of the clock timing adjust circuit in a synchronous memory device described above is illustrative only and not intended to be limiting. In other embodiments, the clock timing adjust circuit can be configured to remove or add clock stages for low or high frequency read operations in a synchronous memory device. Furthermore, in other embodiments, the clock timing adjust circuit can be configured to remove or add clock stages for low or high frequency write operations in a synchronous memory device.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method in a clocked integrated circuit receiving an input clock signal having a clock frequency and a command signal for accessing a memory element in the clocked integrated circuit, the method comprising:

receiving the command signal for accessing the memory element in the clocked integrated circuit, wherein the command signal is a read command signal for reading data from the memory element or a write command signal for writing data to the memory element;

detecting the input clock signal having a clock frequency above or below a frequency threshold, wherein the detecting comprises low pass filtering the input clock signal at the frequency threshold;

generating a clock detect output signal having a first logical state in response to the clock frequency being below the frequency threshold;

generating the clock detect output signal having a second logical state in response to the clock frequency being above the frequency threshold;

adjusting the command signal by a first timing latency to generate a timing adjusted control signal, the first timing latency being one or more clock periods of the input clock signal;

adjusting the first timing latency in response to the clock detect output signal;

applying the timing adjusted control signal to the memory element to access the memory element to obtain read data from the memory element in response to the command signal being the read command signal, the memory element providing the read data under the control of the timing adjusted control signal; and applying the timing adjusted control signal to the memory element to access the memory element to provide write data to the memory element in response to the command signal being the write command signal, the memory element capturing the write data under the control of the timing adjusted control signal.

2. The method of claim 1, further comprising:

adjusting the command signal by the first timing latency in response to the clock detect output signal having the first logical state to generate the timing adjusted control signal being the command signal delayed by the first timing latency;

adjusting the first timing latency to a second timing latency in response to the clock detect output signal having the second logical state; and adjusting the command signal by the second timing latency in response to the clock detect output signal having the second logical state to generate the timing adjusted control signal.

3. The method of claim 2, wherein adjusting the first timing latency to a second timing latency in response to the clock detect output signal having the second logical state comprises:

adding one or more clock periods to the first timing latency to generate the second timing latency.

4. The method of claim 2, wherein adjusting the first timing latency to a second timing latency in response to the clock detect output signal having the second logical state comprises:

removing one or more clock periods from the first timing latency to generate the second timing latency.

5. The method of claim 1, further comprising:

adjusting the command signal by the first timing latency in response to the clock detect output signal having the second logical state to generate the timing adjusted control signal being the command signal delayed by the first timing latency;

adjusting the first timing latency to a second timing latency in response to the clock detect output signal having the first logical state; and adjusting the command signal by the second timing latency in response to the clock detect output signal having the first logical state to generate the timing adjusted control signal.

6. The method of claim 5, wherein adjusting the first timing latency to a second timing latency in response to the clock detect output signal having the first logical state comprises:
adding one or more clock periods to the first timing latency to generate the second timing latency.

7. The method of claim 5, wherein adjusting the first timing latency to a second timing latency in response to the clock detect output signal having the first logical state comprises:
removing one or more clock periods from the first timing latency to generate the second timing latency.

8. The method of claim 5, wherein:
adjusting the command signal by a first timing latency to generate a timing adjusted control signal comprises delaying the command signal through a plurality of clock stages to generate the timing adjusted control signal, the plurality of clock stages determining the first timing latency; and
adjusting the first timing latency in response to the clock detect output signal comprises adjusting the number of clock stages in the plurality of clock stages.

9. The method of claim 8, wherein adjusting the number of clock stages in the plurality of clock stages comprises removing one or more clock stages from the plurality of clock stages.

10. The method of claim 8, wherein adjusting the number of clock stages in the plurality of clock stages comprises adding one or more clock stages to the plurality of clock stages.

11. The method of claim 1, wherein:
detecting the input clock signal having a clock frequency above or below a frequency threshold comprises detecting the input clock signal against a plurality of frequency thresholds;
generating the clock detect output signal comprises generating a multi-bit clock detect output signal indicating a frequency range of the clock frequency; and
adjusting the first timing latency in response to the clock detect output signal comprises adjusting the first timing latency in response to the multi-bit clock detect output signal.

12. The method of claim 2, wherein the clocked integrated circuit comprises a clocked memory circuit and the command signal is the read command signal to read data from the memory element being a memory array in the clocked memory circuit, the method comprising:
in response to the clock detect output signal having the second logical state, adjusting the first timing latency to the second timing latency by advancing the second timing latency by one or more clock periods as compared to the first timing latency; and
adjusting the command signal by the second timing latency in response to the clock detect output signal having the second logical state to generate the timing adjusted control signal.

13. The method of claim 2, wherein the clocked integrated circuit comprises a clocked memory circuit and the command signal is the write command signal to write data to the memory element being the memory array in the clocked memory circuit, the method comprising:
in response to the clock detect output signal having the second logical state, adjusting the first timing latency to the second timing latency by delaying the second timing latency by one or more clock periods as compared to the first timing latency; and
adjusting the command signal by the second timing latency in response to the clock detect output signal having the second logical state to generate the timing adjusted control signal.

14. A method in a microprocessor integrated circuit receiving an input clock signal having a clock frequency and a command signal for accessing a memory element in a macro block of the microprocessor integrated circuit, the method comprising:
receiving the command signal for accessing the memory element in the macro block of the microprocessor integrated circuit, the memory element comprising one of a memory array, a register, or a bank of registers, wherein the command signal is a read command signal for reading data from the memory element in the macro block of the microprocessor integrated circuit, or a write command signal for writing data to the memory element in the macro block of the microprocessor integrated circuit;
detecting the input clock signal having a clock frequency above or below a frequency threshold, wherein the detecting comprises low pass filtering the input clock signal at the frequency threshold;
generating a clock detect output signal having a first logical state in response to the clock frequency being below the frequency threshold;
generating the clock detect output signal having a second logical state in response to the clock frequency being above the frequency threshold;
adjusting the command signal by a first timing latency to generate a timing adjusted control signal, the first timing latency being one or more clock periods of the input clock signal;
adjusting the first timing latency in response to the clock detect output signal;
applying the timing adjusted control signal to the memory element to access the memory element to obtain read data from the memory element in response to the command signal being the read command signal, the memory element providing the read data under the control of the timing adjusted control signal; and
applying the timing adjusted control signal to the memory element to access the memory element to provide write data to the memory element in response to the command signal being the write command signal, the memory element capturing the write data under the control of the timing adjusted control signal.

15. The method of claim 14, further comprising:
adjusting the command signal by the first timing latency in response to the clock detect output signal having the first logical state to generate the timing adjusted control signal being the command signal delayed by the first timing latency;
adjusting the first timing latency to a second timing latency in response to the clock detect output signal having the second logical state; and
adjusting the command signal by the second timing latency in response to the clock detect output signal having the second logical state to generate the timing adjusted control signal.

16. The method of claim 15, further comprising:
in response to the clock detect output signal having the second logical state, adjusting the first timing latency to the second timing latency by advancing the second timing latency by one or more clock periods as compared to the first timing latency; and adjusting the command signal by the second timing latency in response to the clock detect output signal having the second logical state to generate the timing adjusted control signal.

17. The method of claim 15, further comprising:

in response to the clock detect output signal having the second logical state, adjusting the first timing latency to the second timing latency by delaying the second timing latency by one or more clock periods as compared to the first timing latency; and adjusting the command signal by the second timing latency in response to the clock detect output signal having the second logical state to generate the timing adjusted control signal.

18. The method of claim 15, wherein adjusting the first timing latency to a second timing latency in response to the clock detect output signal having the second logical state comprises:

adding one or more clock periods to the first timing latency to generate the second timing latency.

19. The method of claim 15, wherein adjusting the first timing latency to a second timing latency in response to the clock detect output signal having the second logical state comprises:

removing one or more clock periods from the first timing latency to generate the second timing latency.

20. The method of claim 14, further comprising:

adjusting the command signal by the first timing latency in response to the clock detect output signal having the second logical state to generate the timing adjusted control signal being the command signal delayed by the first timing latency;

adjusting the first timing latency to a second timing latency in response to the clock detect output signal having the first logical state; and adjusting the command signal by the second timing latency in response to the clock detect output signal having the first logical state to generate the timing adjusted control signal.

\* \* \* \* \*